United States Patent [19]

Proebsting

[11] Patent Number: 5,713,005
[45] Date of Patent: Jan. 27, 1998

US005713005A

[54] METHOD AND APPARATUS FOR PIPELINING DATA IN AN INTEGRATED CIRCUIT

[75] Inventor: Robert J. Proebsting, Los Altos Hills, Calif.

[73] Assignee: Townsend and Townsend and Crew LLP, San Francisco, Calif.

[21] Appl. No.: 386,581

[22] Filed: Feb. 10, 1995

[51] Int. Cl.$^6$ ........................................................ G06F 9/38
[52] U.S. Cl. ............................................ 395/496; 395/559
[58] Field of Search ................................ 395/494, 496, 395/559

[56] References Cited

PUBLICATIONS

Choi, et al., "16–Mb Synchronous DRAM with 125–Mbyte/s Data Rate," *IEEE J. Solid–State Circuits* 29:529–533 (1994).

L.W. Cotten, "Maximum–rate pipeline systems", *Spring Joint Computer Conference*, pp. 581–586 (May 14–16, 1969).

Wong et al., "Inserting Active Delay Elements to Achieve Wave Pipelining", *IEEE Computer Society Press*, pp. 270–273 (1989).

Jong et al., "Single Polysilicon Layer Advanced Super High–Speed BiCMOS Technology", *IEEE*, pp. 182–185 (1989).

Wong et al., "Designing High–Performance Digital Circuits Using Wave Pipelining", *IFIP*, 241–252 (1990).

Wong et al., "Techniques for Designing High–Performance Digital Circuits Using Wave Pipelining", *A Dissertation Submitted to the Department of Electrical Engineering and the Committee on Graduate Studies of Stanford University*, pp. ii–xvii and pp. 1–189 (Aug., 1991).

Wong et al., "A Bipolar Population Counter Using Wave Pipelining to Achieve 2.5x Normal Clock Frequency", *IEEE*, pp. 56–57 and 242 (1992).

Takai et al., "250Mbyte/sec Synchronous DRAM Using a 3–Stage–Pipelined Architecture", *1993 Symposium on VLSI Circuits; Digest of Technical Papers*, (May 19–21, 1993).

Burleson, W., et al., "Wave–Pipelining: Is It Practical?", *IEEE Proc*, ISCAS '94, pp. 163–166, Jun., 1994.

Fujiwara, A., et al., "A 200MHz 16Mbit Synchronous DRAM with Block Access Mode," 1994 Symp. on VLSI Circuits, *Digest of Technical Papers*, pp. 79–80, May 1994.

*Primary Examiner*—Thomas M. Heckler
*Attorney, Agent, or Firm*—Townsend and Townsend and Crew LLP

[57] ABSTRACT

A method and apparatus for pipelining data is used in a synchronous integrated memory circuit in which a read cycle is initiated by a first clock received on a clock input. The data associated with the read cycle propagates asynchronously through the memory to produce data which is then input to the pipeline circuit. The apparatus includes steering circuitry with precise timing for steering the data produced in the read cycle into an asserted one of several branches of a register. Selection circuitry is used to select for output the data which has been stored in the asserted branch upon receipt of a subsequent clock. The subsequent clock is one which occurs a programmable number of clocks after the first clock.

68 Claims, 11 Drawing Sheets

METHOD AND APPARATUS FOR PIPELINING DATA IN AN INTEGRATED CIRCUIT

BACKGROUND OF THE INVENTION

The present invention generally relates to systems for processing data. Specifically, the invention relates to a method and apparatus for producing output data from a circuit a selected number of clocks after a read cycle is initiated in the circuit.

Semiconductor memory systems have evolved rapidly in the past years. Memory system sizes have roughly doubled every three years, as the number of bits per memory chip was increasing by a factor of four. Therefore, with each new generation of DRAMS, only half as many individual chips are needed in a memory system. With a reduction in the number of memory chips in a system, there is a reduction in the total number of data output pins. With fewer output pins, the bandwidth of the memory system decreases. However, as microprocessor and multiprocessor systems advance, the demands on memory systems continue to increase. Most critically, computer systems require greater and greater data bandwidths. That is, the systems demand that more information be presented at the output pads of the memories in any given time interval. There is therefore a need to increase the bandwidth of each memory chip. Achievement of these greater bandwidths is complicated by the need to preserve precious gains in bit density and substrate space.

This need to increase bandwidth has led to the development of new types of memory systems. One promising new memory chip architecture is the Synchronous Dynamic or Static Random Access Memory (SDRAM or SSRAM). These chips use a clock to control data flow and thereby provide significant increases in output data bandwidth over that provided by previous memory chips. In these synchronous designs, pipelining is used to increase the bandwidth of data output. In this discussion, it will be assumed that the address access time through an exemplary SDRAM (from column address to output) is 15 ns. Without pipelining, read cycles can occur every 15 ns. In a synchronous DRAM a latency (or pipeline depth) of three may be used to increase the overall data rate by a factor of three. That is, for a 15 ns address-access-time SDRAM, read requests and data outputs may be made every 5 ns. A first request may be made at time T0. The data from that request will be valid on the output of the DRAM 15 ns (3 clocks) later. A second read request is made at T+5 ns, and a third read request occurs at T+10 ns. The clock occurring at T+10 ns also commands the data resulting from the first read cycle to appear on the outputs. Coincident with the fourth read request at T+15 ns, data from the first request is available at the outputs. This data is followed by new data every 5 ns from subsequent read cycles. The result is a system having a cycle time much less than the address access time, dramatically increasing the bandwidth.

This same 15 ns address-access-time part, if operated with a 7.5 ns cycle time, can output data with only a one clock delay. That is, a first read cycle starts at T0. A second read cycle starts at T+7.5 ns, at which time the data resulting from the first read cycle is commanded to be output. A third cycle starts at T+15 ns as the first data is valid on the outputs and is read out. This operation is referred to as a latency of two. This exemplary 15 ns address-access-time part is too slow to operate correctly with a latency of two at a 5 ns cycle time. DRAMs operating at higher frequencies must use greater latencies. Thus, it is desirable to provide an ability to program the latency of a particular memory part, allowing optimized use at a number of different operating frequencies. It is through the use of pipelining, e.g., starting a second and third cycle before completing an access of the first cycle, that synchronous memories are able to provide a greatly increased bandwidth over previous memory designs.

Unfortunately, however, this increased bandwidth has not yet been achieved without some cost. Current pipeline implementations require the use of a great number of transmission gates or latches to cycle or "step" data through the pipe. A typical pipeline circuit is formed from a plurality of transmission gates made of NMOS and PMOS transistors. Data is clocked through the pipeline circuit by allowing it to sequentially proceed through stages defined by the transmission gates. Thus, for a latency of two, two sets of transmission gates may be used to step the data through the pipe. A first set of gates are enabled to advance the data received at the input buffers through the memory. A second set of gates, positioned later in the data path, are enabled to advance the data to the output as new data starts at the input. Latencies of three, similarly, require three sets of transmission gates, disposed at several locations through each parallel data path.

Although this approach achieves the general goals of pipelining output data from a synchronous circuit, it is unsatisfactory for several reasons. The large number of transmission gates required by such an approach adversely affects several important RAM design characteristics. The intermediate transmission gates in a SDRAM may, for example, be optimally placed at the output of each column decoder of the memory. These memories have a large number of column decoder outputs. Therefore, a very large number of transmission gates is required to generate, e.g., a latency of three. Each of these transmission gates consumes power, takes up valuable substrate area, and adds both resistance and capacitance in the signal path, thereby adding delay to the address access time. As a result, synchronous DRAM circuits utilizing common pipelining techniques occupy substantially greater substrate space than asynchronous circuits of similar capacity. Further, use of these common techniques creates memory devices having increased power requirements and increased address access times although they do achieve the objective of decreased cycle time.

The large number of transmission gates is increased even further when a programmable latency is used. For example, if a selectable latency of either two or three is implemented using transmission gates, the optimum placement of the gates in the overall data path is different for the different latencies. Substrate space is consumed rapidly using this approach.

Accordingly, a high speed pipelining technique is needed which reduces or eliminates the need for multiple transmission gates in the data path. It is further desirable that the technique support a programmable latency of any desired value. These needs should be satisfied without significantly compromising gains in bit density, substrate area, and power consumption.

SUMMARY OF THE INVENTION

The present invention offers a pipeline circuit allowing for a programmable latency which is capable of pipelining data at very high frequencies without occupying excess substrate area.

In particular, a method and apparatus for pipelining data is provided for use in synchronous systems. In one specific embodiment the apparatus is designed for use in conjunction with a memory system in which a read cycle is initiated by a first clock received on a clock input. The read cycle asynchronously produces data which is then input to the pipeline circuit. The circuit includes steering circuitry for steering the data produced in the read cycle into an asserted one of several branches of a register. Selection circuitry is used to select for output data from the asserted branch upon receipt of a subsequent clock. The subsequent clock is one which occurs some number of clocks after the first clock.

In one specific embodiment, the number of clocks after the first clock is one (i.e., a pipeline effect having a latency of two is achieved). In another embodiment the number of clocks after the first clock is two (i.e., a latency of three is achieved). Yet another embodiment of the present invention allows for a programmably selected latency of between one and three.

Each of the branches of the system contains a pair of latches, one of which is responsive to a logical "1" input signal and the other responsive to a logical "0" input signal. Reset circuitry is also provided to reset the pair of latches in each of the pipeline branches. In one specific embodiment, the pair of latches in each branch is reset immediately upon deselection of that branch from the output. A single branch is reset during each cycle.

A synchronous wrap-around counter system is provided to work in conjunction with the steering circuitry to cycle through the branches into which the data is steered and latched. The counter is also directly used to select a branch for output data. The counter is self starting and increments quickly with each clock.

Steering circuitry is also provided. The steering circuitry sequentially asserts one of a plurality of signals for a period of time equivalent to one cycle time, the sequencing timed to increment just before the arrival of a narrow data pulse. The data pulse is preferably narrow with respect to the clock cycle time. The assertion of the steering signal before arrival of the narrow data pulse operates to steer the data pulse to one of several branches of the system. A common timing signal is used to enable accurate relative timing of the assertion of the steering signal slightly before arrival of the data pulse. In one specific embodiment, the common timing signal is generated by detecting the presence of a pulse on one of a number of predecode signal lines. The common timing signal is then used to strobe sense amplifiers (thus generating a data pulse) and to also provide the precise timing of the steering signal. This use of a common timing signal late in the data path of the system allows data signals to be steered at high frequencies. The arrangement accommodates variations in timing caused by fluctuations in temperature, power supply voltage, and the like.

Circuitry is also provided to allow disabling of the output of the system on a cycle by cycle basis. Other specific embodiments of the present invention include features for preventing glitches in the output of the pipeline, even if data is selected for output before the data becomes available.

The result is a small, efficient, high-speed pipeline circuit with a programmable latency. Accurate timing is accomplished by utilizing a common timing signal to both produce data and to steer information to one of several registers. Data flows asynchronously from the input of the memory circuit to the input of the pipeline circuit without the use of transmission gates. For a fuller understanding of the nature and advantages of the invention, reference should be made to the ensuing description taken in conjunction with the accompanying drawings.

DESCRIPTION OF THE PREFERRED EMBODIMENT

Figure 1:
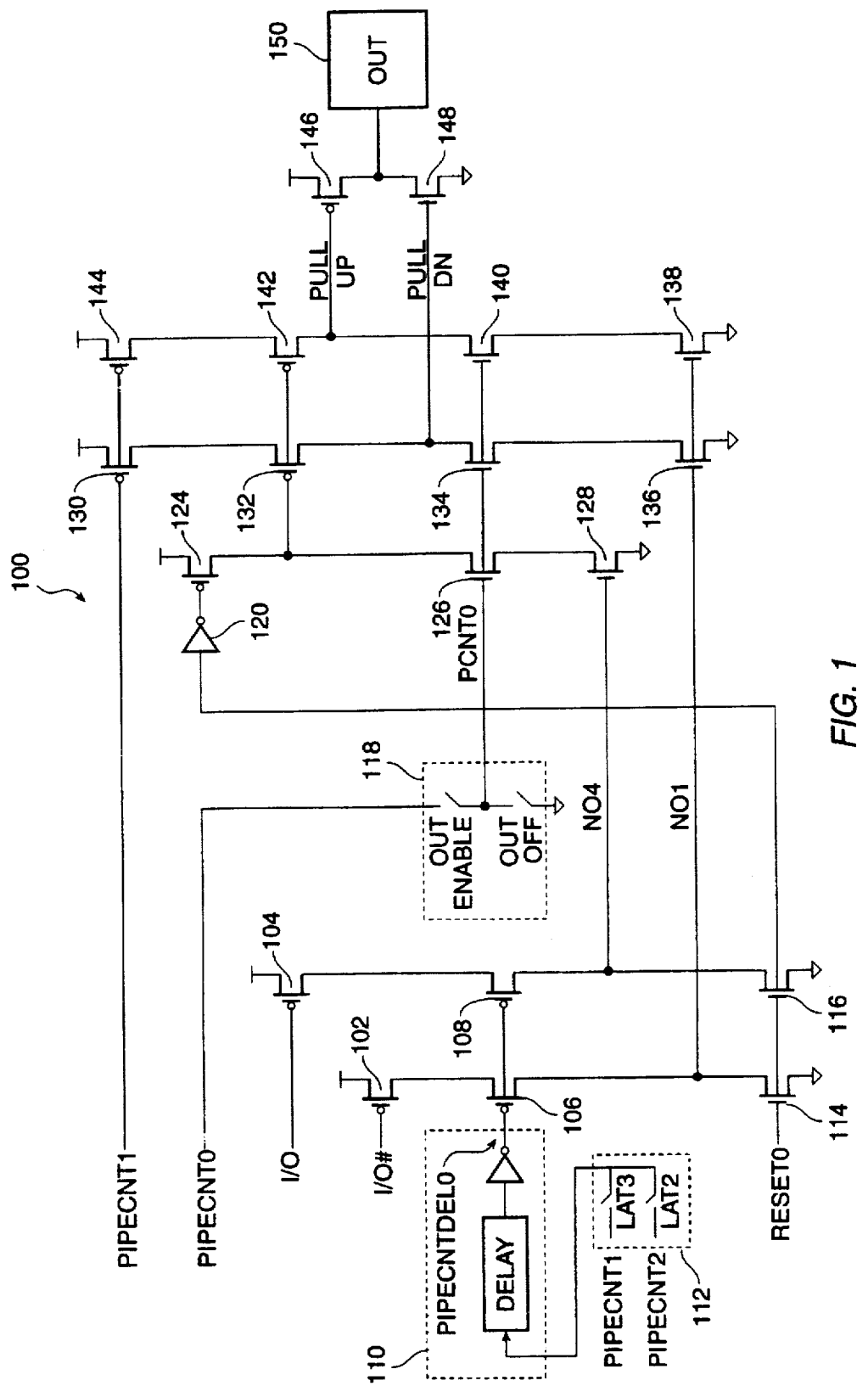
FIG. 1 is a simplified circuit diagram of a portion of a steering circuit according to one specific embodiment of the present invention.

Referring now to FIG. 1, a latency steer circuit 100 according to the present invention is shown. This circuit is one of three identical sections or branches shown in FIG. 2. It is somewhat simplified compared to the circuit of FIG. 2, yet includes functions from other circuits shown in FIGS. 6, 8, and 11 to get an overview of the overall operation. The steering circuit 100 is used to steer data signals from compliment or true I/O signal lines (hereinafter I/O# and I/O) to a node N01 or N04 respectively of one asserted branch and from there to an output pad 150 of, e.g., a synchronous memory device. The circuit uses a number of control signals to ensure that data from the I/O lines propagates to the output pad 150 with precise timing. The steering of signals may be used to quickly and accurately pipeline output data from a memory device. Those skilled in the art will appreciate that the present invention may be used in conjunction with any synchronous memory device, including DRAMs, SRAMs, ROMs, flash memory, and the like. Further, the pipelining scheme of the present invention may be modified for use in other applications where an efficient, high-speed pipeline is required.

Throughout this specification, a specific embodiment of the present invention will be described. In particular, an embodiment designed for use in the output data path of a DRAM system will be discussed. In this particular embodiment, data is propagated through the DRAM in the form of pulses (e.g., 1–5 ns wide pulses). In a preferred embodiment, the circuitry may be implemented by using fast propagation CMOS logic as described in the commonly assigned U.S. Pat. No. 5,519,344 filed Jun. 30, 1994 entitled "Fast Propagation Technique In CMOS Integrated Circuits", which is incorporated herein by reference. Those skilled in the art will recognize that other implementations may also be used.

A clock cycle initiating a read cycle in this particular embodiment will cause four actions to occur. First, two storage nodes of a branch of a circuit (such as nodes N01 and N04 of the branch depicted in FIG. 1) will be reset. Next, at the same time, a conventional asynchronous read access will commence, concluding with a data pulse on either an I/O or an I/O# line. Third, the read cycle will cause the generation of a steering signal which will become asserted slightly before the arrival of the asynchronous data pulse. Finally, the steering signal will cause data from I/O or I/O# to be steered onto an appropriate storage node, setting one of the storage nodes. A subsequent clock cycle will select this data for output. The data may be output to any of a number of receiving circuits (e.g., processor, cache memory, or the like).

At least two circuits 100 are needed to achieve a latency of two, and at least three circuits 100 must exist in parallel to achieve a latency of three. Greater latencies may also be attained by providing a greater number of circuits 100. In one specific embodiment, the pipeline circuitry of the present invention allows user specification of latencies from one to three. Certain aspects of the latency steer circuit 100 of FIG. 1 have been generalized to simplify explanation of the operation of the circuit. Further detail will be given in conjunction with later figures.

In one specific embodiment, I/O signals from the memory device are high during standby. Therefore, a low signal on either line indicates the presence of data. These signals are generally negative data pulses which may be, e.g., 2 ns wide. In one specific embodiment, I/O signals are generated after an asynchronous delay of about 10 ns following a memory read access request. However, with the use of pipelining, memory requests can be made at intervals less than the access time. A latency of two will pipeline data to permit I/O signals to occur every 7.5 ns and new data to be placed on the output pad 150 every 7.5 ns. A latency of three will permit I/O signals and new output data to occur at 5 ns intervals.

The symbol for PMOS transistors, such as 102 and 104, includes a circle (bubble) on the gate. The symbol for NMOS transistors, such as 114 and 116 has no such circle. The short horizontal lines above the sources of PMOS transistors 102 and 104 indicate the positive power supply, Vcc. The sources of NMOS transistors 114 and 116 are connected to ground.

As either the I/O# or I/O line pulses low, PMOS transistor 102 or 104 is turned on. At this time, PIPECNTDEL0 is asserted low in one circuit 100 enabled to receive data (and PIPECNTDEL1 and PIPECNTDEL2 are high in other circuits 100). The low pulse on the I/O# or I/O combined with the low level on PIPECNTDEL0 causes either (previously reset low) node N01 or N04 to be set, i.e., pulled up to the positive supply voltage, Vcc. Nodes N01 and N04, essentially, comprise a pair of data latches. Node N01 is set high by a received logic "1" and node N04 is set high by a received logic "0".

PIPECNTDEL0 is a signal created by circuitry 110 which will be discussed in more detail in conjunction with FIGS. 7, 8 and 9. The timing of the assertion of the PIPECNTDEL0 signal is controlled by circuitry 110. In general terms, the PIPECNTDEL signals are timed to occur in conjunction with the arrival of signals on the I/O lines. The PIPECNT-DEL signals, being of relatively long duration, create a window within which the I/O signal may occur. Corresponding signals (e.g., PIPECNTDEL1 and 2) are provided to corresponding circuit branches not shown in this figure. The choice of which PIPECNTDEL (0, 1, or 2) is enabled to receive data changes from cycle to cycle and depends upon the latency chosen (e.g., two, three, or more) and on the state of a counter (PIPECNT). The choice is controlled by circuit 112. Circuits 110 and 112 will later be discussed in more detail in conjunction with FIG. 8. Together, these circuits 110 and 112 steer the negative data pulse from the I/O# or I/O line to node N01 or N04 of the circuit 100 enabled to receive data. By "steering" it is meant that if a signal (e.g., in the form of a negative pulse) occurs on line I/O# when signal PIPECNTDEL0 is asserted low, enabling branch 0 to receive data, the signal will be steered to node N01 setting it high while not affecting corresponding nodes in other circuits 100. If a negative pulse arrives on line I/O, and if signal PIPECNTDEL0 is asserted low, that data is steered to node N04, setting it high. If a signal arrives on either line I/O or I/O# and PIPECNTDEL0 is not asserted low (because PIPECNTDEL1 or 2 is asserted low), that data is steered to another branch and neither node N01 nor N04 will be changed. This feature allows signals arriving on a single set of I/O lines in consecutive cycles to be steered to a number of different nodes in different branches to achieve a pipelining effect.

Once data has been appropriately steered to a particular node (e.g., nodes N01 or N04 of FIG. 1), it waits there until the appropriate clock input arrives. Upon arrival of the appropriate clock input, PCNT0 is quickly selected high. This allows the data to then be propagated to an output pad 150. The PCNT0 signal is, essentially, derived from a PIPECNT0 signal which is generated by a counter to be discussed in conjunction with FIG. 7. The PCNT0 signal is selected high only if count signal PIPECNT0 has been selected high, and if the output is to be enabled this cycle. In one specific embodiment, the output control circuitry includes a feature which allows the output to be turned off (open circuit), thereby freeing the memory output pads to carry another signal. This control circuitry will be discussed in more detail infra in conjunction with FIGS. 6 and 11.

The selection of PCNT0 turns on NMOS transistors 126, 134, and 140. This, combined with a high "set" level on either node N01 or N04 causes the output pad 150 to be pulled either high or low. For example, if a negative pulse has arrived on line I/O, when the PIPECNTDEL0 signal was asserted low, transistors 104 and 108 will be simultaneously turned on to set node N04 high (both nodes N01 and N04 had been previously reset low). Node N04 is coupled to the gate of NMOS transistor 128. As node N04 goes high, transistor 128 is turned on. Receipt of a clock input (after the input that initiated this read cycle) causes the selection of PIPECNT0 and PCNT0 (output enabled) which turns NMOS transistor 126 on. With both transistors 128 and 126 on, the gates of PMOS transistors 132 and 142 are pulled to ground, turning these transistors on. When PIPECNT0 is selected high, PIPECNT1 is not selected, i.e. is low. As will be discussed in more detail, these PIPECNT signals are generated by a high-speed synchronous wrap-around counter. Only one of the signals (PIPECNT0-2) is selected high at any given time. With PIPECNT1 low, PMOS transistors 130 and 144 are turned on. With PMOS transistors 130 and 132 both on, node PULLDN is pulled to Vcc, turning on NMOS output transistor 148. With PMOS transistors 144 and 142 both on, node PULLUP is also pulled to Vcc, turning off PMOS output transistor 146. Thus, the output pad 150 is pulled down to ground. At this time node N01 is still reset low so NMOS transistors 136 and 138 are off. In a similar fashion, if data has arrived on line I/O# node N01 has been set high through PMOS transistors 102, 106, and node N04 is still reset low. In this case, when PCNT0 is selected high, lines PULLUP and PULLDN will be pulled to ground via transistors 140, 138, and 134, 136. This will turn on PMOS transistor 146, and turn off NMOS transistor 148, pulling the output pad 150 high.

Due to the high speed at which signals are propagated through the system, lines PULLUP and PULLDN are potentially subject to glitches in output. Several features are provided to avoid glitches in the output. First, as soon as the current PIPECNT (output) cycle is complete, as a result of receipt of the next clock input, PMOS transistors 130 and 144 will be rendered non-conducting because the next pipecount, PIPECNT1, is quickly selected high. Also at this time, NMOS transistors 126, 134 and 140 will be turned off by the deselection of PCNT0 low. With NMOS transistors 134, 140 and PMOS transistors 130, 144 all off, this particular branch no longer affects the state of PULLUP or PULLDN. As a result, PULLUP and PULLDN remain at their present voltages until driven to new voltages by the next selected branch, (or by output disable circuitry). If, on the simultaneous deselection of the present branch and selection of the next branch, data has not yet arrived on the equivalents of node N01 or N04 of the next branch (e.g., nodes N02 and N05 of branch 1), still no glitch occurs in the output. Instead, as the next branch is selected nothing yet happens. Only when data finally arrives to set node N02 or N05 of the next branch are nodes PULLUP or PULLDN changed in voltage. Thus the output remains high, low, or open circuit until the next data is available for output. If the next data happens to be the same data as the present data, nodes PULLUP and PULLDN do not change voltage and therefore the output has no glitch, even if the next PIPECOUNT selected data before that data was available.

Those skilled in the art will recognize that PULLUP may be designed to rise faster than PULLDN rises, causing PMOS transistor 146 to turn off faster than NMOS transistor 148 turns on. Likewise, PULLDN may be designed to fall faster than PULLUP falls, causing NMOS transistor 148 to turn off faster than PMOS transistor 146 turns on. This will result in a savings in power consumption.

To ensure that a valid signal is placed at nodes N01 and N04, a RESET0 signal is also provided. This signal, for branch 0 (the branch selected to output data by PIPECNT0), in one specific embodiment, is selected as a positive pulse at the beginning of a cycle in which the PIPECNT1 signal has been selected high (i.e., immediately after the cycle in which PIPECNT0 had been selected to output data). The RESET0 signal is coupled to the gates of NMOS transistors 114 and 116. Assertion of the signal with a positive pulse resets nodes N01 and N04 to ground, a condition representing that no data is yet available at these nodes. The signal is also inverted by inverter 120 whose output turns on PMOS transistor 124 which resets high the gates of PMOS transistors 132 and 142, again a condition representing that no data is yet available. Once each of these nodes is properly reset, the circuit is ready to receive new data in the form of a negative pulse on I/O or I/O# the next time PIPECNTDEL0 again steers data into branch 0. This new data will be output the next time PIPECNT0 is selected high. Note that the reset pulse timing must terminate before new data on I/O or I/O# is steered by PIPECNTDEL0 into this specific branch (branch 0). In one specific embodiment of the present invention, when the latency is set to three, there is a 10 ns window in which to start and stop the RESET pulse before new data arrives at a node. This time is independent of clock cycle time. At a latency of two, even more time is available. Those skilled in the art will be able to adjust the timing of the RESET pulse within this window.

Although circuit 100 is somewhat simplified, several aspects of the present invention are shown. First, signals presented on the I/O lines are not propagated (steered) to nodes N01 or N04 unless the PIPECNTDEL0 signal is asserted low at the time the I/O or I/O# signal appears. Because the I/O signals may be, e.g., 2 ns wide pulses occurring at quick intervals (such as 5 ns in certain embodiments), proper timing of the PIPECNTDEL0 signal is necessary. This timing is coordinated through use of delay circuitry 110. The choice of which PIPECNTDEL signal is asserted during any given cycle is determined by the state of the PIPECNT counter at the time the read request was initiated, and by the selected latency. This is accomplished by the circuit 440 of FIG. 8. Once data has set node N01 or N04 high, it is selected for output only when PCNT0 is selected which in turn occurs only when PIPECNT0 is selected (and data output is enabled by output enable circuitry 118). That is, data from nodes N01 or N04 does not get placed on the output pad 150 until the PCNT0 signal has been selected some number of clocks later. This gating effect is used to control the pipelining of data. By replicating the circuit 100 of FIG. 1 N times a data pipeline having any depth from two to N can be formed.

Figure 2A:
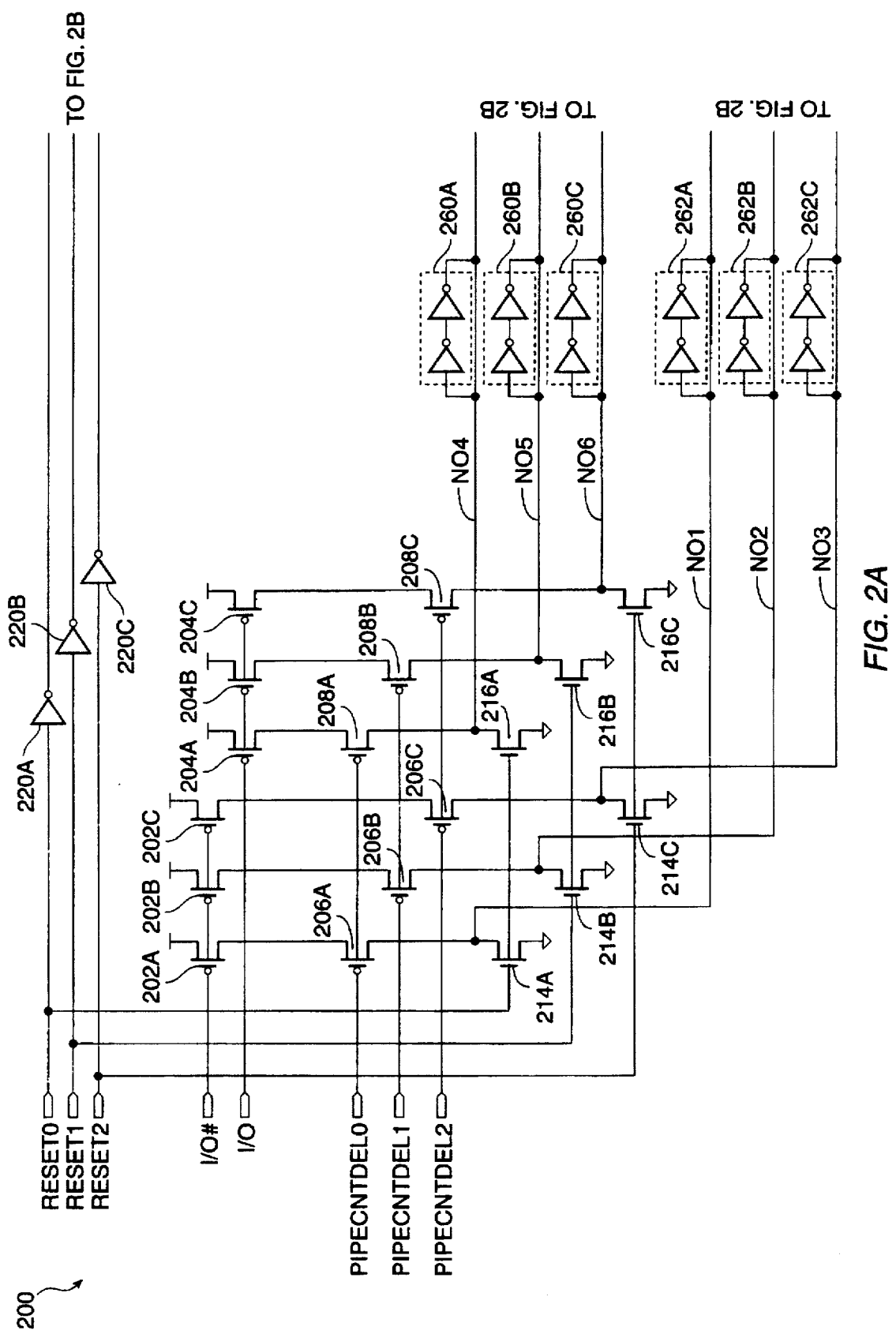
FIG. 2 is a circuit diagram of a steering circuit according to one specific embodiment of the present invention.
Figure 2B:
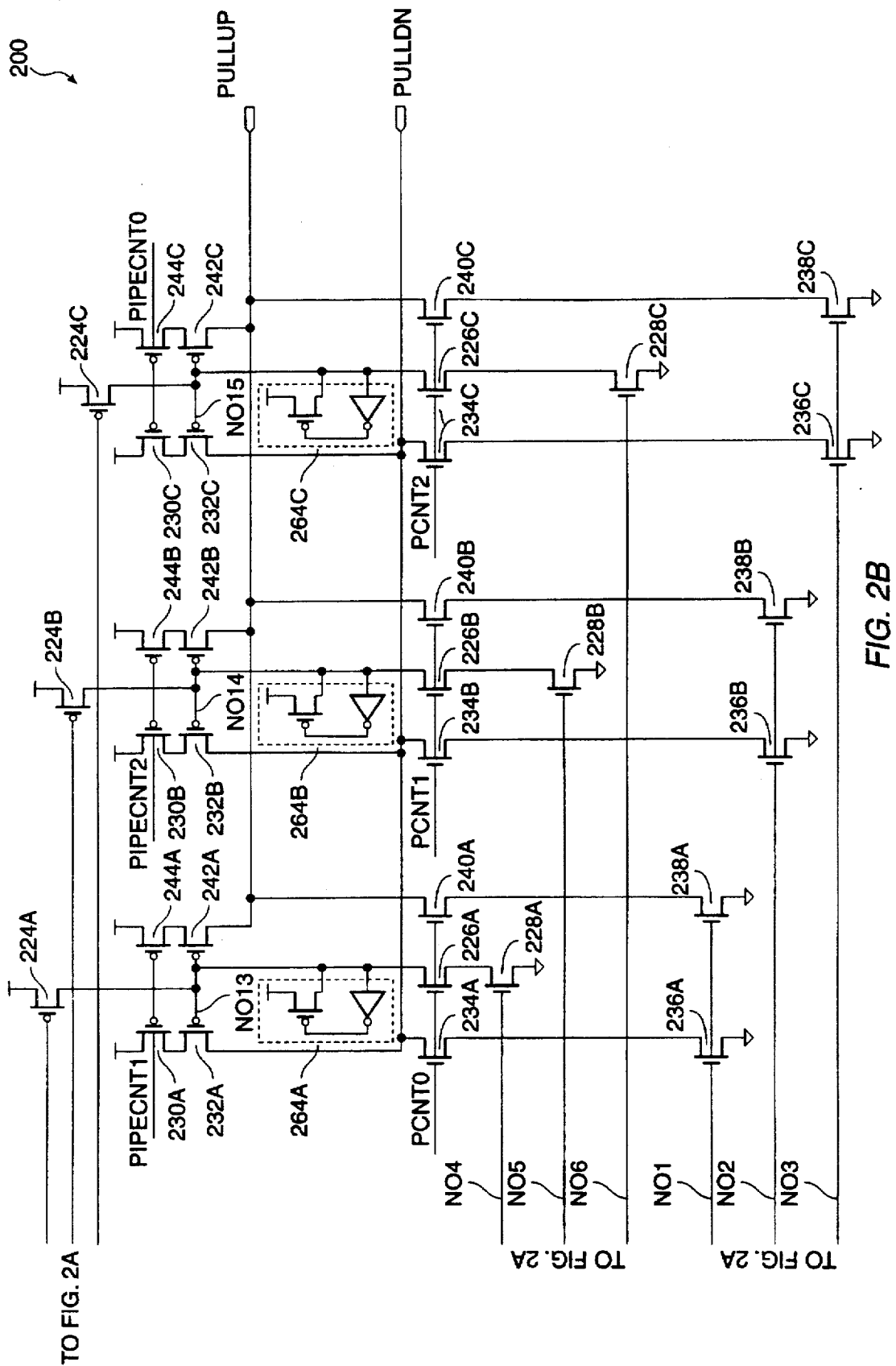

Referring now to FIG. 2, one specific embodiment of a steering circuit 200 according to the present invention is shown. This circuit, with three identical branches, supports latencies of two or three. A latency of one is achieved by a separate circuit to be described later. Each of the three branches is, for the most part, a replica of the circuit 100 shown in FIG. 1. Those skilled in the art will realize that higher latencies may be attained through use of a greater number of branches. Certain features included in FIG. 1, such as the delay circuitry 110, latency selection circuitry 112, output control circuitry 118, and output transistors 146 and 148, are not shown in the diagram of FIG. 2. Instead, specific embodiments of these features will be discussed infra.

Several features of one specific embodiment of the present invention, not contained in FIG. 1, are shown in FIG. 2. Specifically, each of the storage nodes N01-N06 contains a latch 262A-C, 260A-C formed from a pair of inverters. These latches are used to ensure that information is retained at each of these nodes, even when the system is operated at low frequencies where leakage current could be a concern. They are formed to have a high enough impedance to ensure that they may be overpowered by their respective reset pulses or by new data on I/O or I/O#, yet have a low enough impedance to overcome any leakage current on their respective nodes. Similar latches throughout this specification are also overpowered by their respective input signals. By providing latches on these nodes, operation at very low frequency is supported. Additional PMOS latches 264A-C are positioned to hold nodes N013-N015 high. Once these nodes are set high, latches 264A-C maintain the high level until a change of signal occurs. The nodes N013-N015 are reset high by PMOS transistors 224A-C when their respective RESET signals are asserted. Note that the RESET function does not reset the signals at lines PULLUP or PULLDN. Instead, those signals are maintained until replaced by new output data. This helps to ensure a glitchless output. For example, assume that in a first cycle, a negative data pulse from I/O# is received on the gate of transistor 202A, and steered through transistor 206A to storage node N01 of branch 0, causing PULLUP and PULLDN to pull to ground when PCNT0 is selected high. If, in the next cycle, data again appears on line I/O#, it will be steered to node N02 of branch 1, setting it high. This will cause transistors 236B, 238B to pull lines PULLUP and PULLDN to ground (once signal PCNT1 is selected). However, the lines are already at ground, so the final data output remains high. This is the case even if PCNT1 is selected before data arrives to set node N02 high.

When PULLUP and PULLDN need to be pulled high for an output cycle from branch 1, (i.e., data has come in on the true I/O line and been steered to set node N05 high), node N014 is pulled to ground once PIPECNT1 and PCNT1 are selected. This pulls PULLUP and PULLDN high, since PMOS transistors 230B and 244B are on. They are on because PIPECNT2 is unselected low whenever PIPECNT1 is selected high. Further, the end of each PIPECNT cycle is completed by isolating lines PULLUP and PULLDN by turning off the previously selected PMOS transistors 230, 244 and the previously selected NMOS transistors 226, 234 and 240. These transistors are turned off at the same time because, e.g., PIPECNT1 is deselected low as PIPECNT2 is selected high, deselecting branch 1. With PULLUP and PULLDN isolated from one branch at the end of a cycle, these nodes can immediately take on new data as provided by the next branch.

Note that the circuit provides a glitchless (but delayed) transition from cycle to cycle even if new data is requested before it arrives. Assume, again, that the asynchronous delay from the initiation of a read cycle to the generation of a negative pulse on I/O or I/O# is 10 ns. The data, in this example, is steered to branch 0. Also assume a read latency of two, i.e., that the data is selected for output upon receipt of the first clock following the clock that initiated the read cycle of concern. If the clock cycle time is greater than 10 ns, the data will have asynchronously propagated through the memory before it is selected for output. That is, node N01 or N04 will have been set high before PCNT0 is selected high. Immediately on receipt of the next external clock, PCNT0 (or PCNT1 or PCNT2 for following cycles) is selected high and the new data appears at the output as previously described. If, on the other hand, the cycle time is less than 10 ns, the data is requested before it is available. That is, PIPECNT0 is selected high before either node N01 or node N04 has been set high, both still being in their reset low state. In this case, selection of PIPECNT0 by the next clock causes no change to the output until the asynchronously propagating data arrives. That is, nodes PULLUP and PULLDN remain in their previous state and the output remains in its previous state, high, low, or open circuit, until new data arrives. Now, when the I/O or I/O# negative data pulse finally occurs, node N04 or N01 is set high, and this new data immediately propagates to the output, PIPECNT0 still being selected high. Again, if the new data is identical to the old, the output remains steady with no glitch. And if the output switches, it retains the previous data valid until new data is available to replace it. The state of the output does not change until two conditions are met: The data has propagated asynchronously through the memory to be available at the output and the appropriate clock has been received to select this data for output. It does not matter which occurs first. However, access time from clock increases if the data propagating asynchronously through the memory is not yet available when PIPECNT advances on the next clock attempting to select that data for output.

Figure 3:
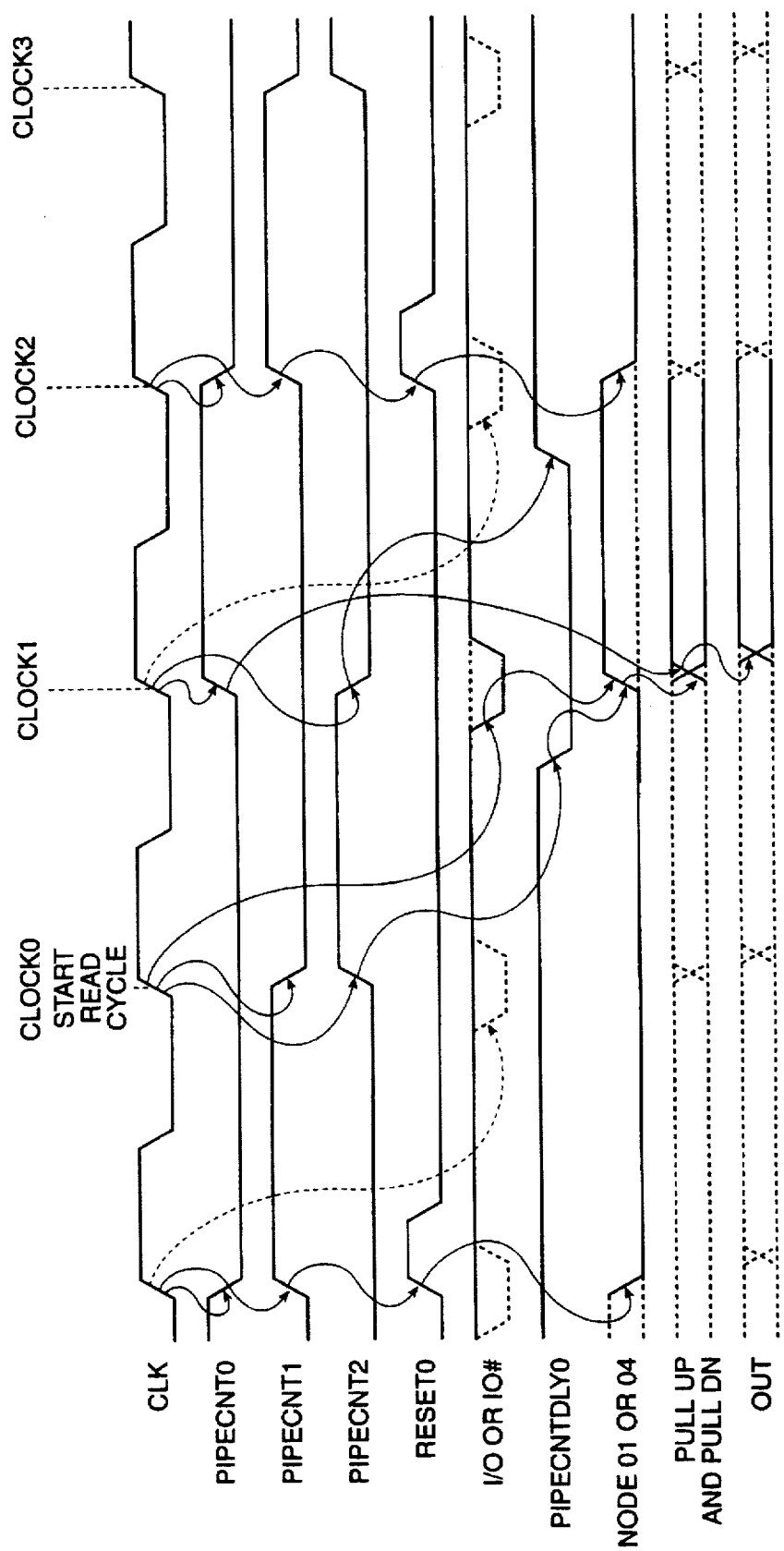
FIG. 3 is a timing diagram of the circuit of FIG. 2 for the case when a latency of two has been selected.

Operation of the circuit 200 at differing latencies will now be described. It will again be assumed that it takes 10 ns for data to propagate asynchronously through the memory and thereby set either node N01 or N04 high. It will be further assumed it takes 5 ns for the output to become valid after, for example, node N04 or N01 is set high and PIPECNT0 is selected high. Referring now to FIG. 3, a timing diagram for a latency of two is shown. In this example, data requests are being made approximately every 11 ns. The diagram of FIG. 3 shows the interaction of signals required to propagate an output signal through a single branch of the circuit 200 of FIG. 2. Specifically, the data is shown as being steered by PIPECNTDEL0 to either set node N01 or node N04 high (dependent upon whether the negative data pulse occurred on I/O# or I/O). This branch, selected by PIPECNT0 and PCNT0, is referred to as branch 0. The arrows indicate relationships between signals (e.g., where the rising or falling edge of one signal causes the transition of a second signal). As will become apparent by later reference to FIG. 11, the PCNT signals are normally equivalent to the respective PIPECNT signals. Only when the output has been disabled are there differences. Thus, for the purposes of this discussion, the PIPECNT signals will be referenced.

As shown in FIG. 3, only one of the signals PIPECNT0-2 is selected (high) at any time. The rising edge of every clock cycle triggers transitions between signals. For example, if PIPECNT0 is high, the next rising edge of the clock will cause PIPECNT1 to go high and PIPECNT0 to go low. The rising edge of the clock signal also drives a RESET signal. In one specific embodiment, a RESET0 signal is triggered by the rising edge of PIPECNT1 resetting branch 0 nodes N01 and N04 low and node N013 high. Similarly, the rising edge of PIPECNT2 causes generation of a RESET1 signal, while the rising edge of PIPECNT0 causes generation of a RESET2 signal. Generation and timing of these signals will be discussed further in conjunction with FIG. 10.

A memory read access request is made on a specific clock, labeled for convenience clock 0, and further labeled as the start read cycle. This cycle causes a signal to be output from the memory as a negative pulse on either I/O or I/O# after an asynchronous propagation delay of approximately 10 ns from the time the request was initiated. In the sample shown in FIG. 3, the start read cycle happens to have occurred on a cycle causing the rising edge of PIPECNT2. This causes PIPECNTDEL0 to be asserted low a certain time after the start of the read cycle, independent of whether or not any additional clocks have been received after that (the choice of asserting PIPECNTDEL0 rather than PIPECNTDEL1 is a result of choosing a latency of two, as will be described). For this example in one specific embodiment, PIPECNTDEL0 is asserted low 8.5 ns after commencing the read cycle on clock 0. Thus, independent of clock frequency, this data is steered to branch 0; that is to set either node N01 or N04 high (dependent upon whether the signal occurs on I/O# or I/O). The PIPECNTDEL0 signal is asserted a specified time after selection of the PIPECNT2 signal, more specifically, just before arrival of the data pulse on I/O or I/O#. Sufficient margin is provided to ensure that the I/O signal arrives within the window defined by the current PIPECNTDEL signal (here, PIPECNTDEL0). This margin allows for variations of signal timing caused by temperature, power, or other influences. The generation and timing of the PIPECNTDEL signal will be discussed in more detail later in conjunction with FIG. 8.

Because the negative I/O data pulse associated with this read cycle occurs during the assertion low of the PIPECNTDEL0 signal, the data is steered to a node in branch 0 (i.e., either node N01 or N04). The steering of the negative pulse sets either node N01 or N04 high from its reset low state. The node remains high (thanks, in one embodiment, to a latch) until it is later reset by a RESET0 pulse (e.g., after the cycle reading out that data has been completed). When the next external clock input, clock 1, is received, the next pipecount, PIPECNT0, is selected high as quickly as possible and the previously selected pipecount, PIPECNT2 is quickly deselected low. This selects the new branch and disconnects the previously selected branch. When PIPECNT0 is selected high, transistors 234A, 226A, and 240A are turned on and nodes PULLUP and PULLDN are pulled high if node N04 is set high or pulled low if node N01 is set high. These signals are then propagated to an output pad 150 of the memory device.

The next data to arrive on the I/O lines will be steered to nodes N02 or N05 of branch 1 because the counter will have incremented and the PIPECNTDEL1 signal will be asserted low. This data will drive lines PULLUP and PULLDN when PIPECNT1 is selected immediately after clock 2. One cycle later, data received on the I/O lines will be steered to nodes N03 or N06 of branch 2 by the negative assertion of signal PIPECNTDEL2. Line PULLUP and PULLDN will again receive new data when signal PIPECNT2 is selected upon receipt of clock 3. This process will continue steering data into and then retrieving data from branch 0, 1, 2, 0, 1, 2, 0, etc. The first data could have been steered into any of the branches, depending on the count existing when that read cycle is initiated. After completion of the last read cycle, the output may be open circuited. Circuitry to accomplish this will be described infra in conjunction with FIGS. 5, 6 and 11.

The timing diagram of FIG. 3 shows data arriving on I/O or I/O# before its output is selected, that is, a cycle time of over 10 ns. But a cycle time of 7.5 ns could have been chosen as will be later discussed.

Figure 4:
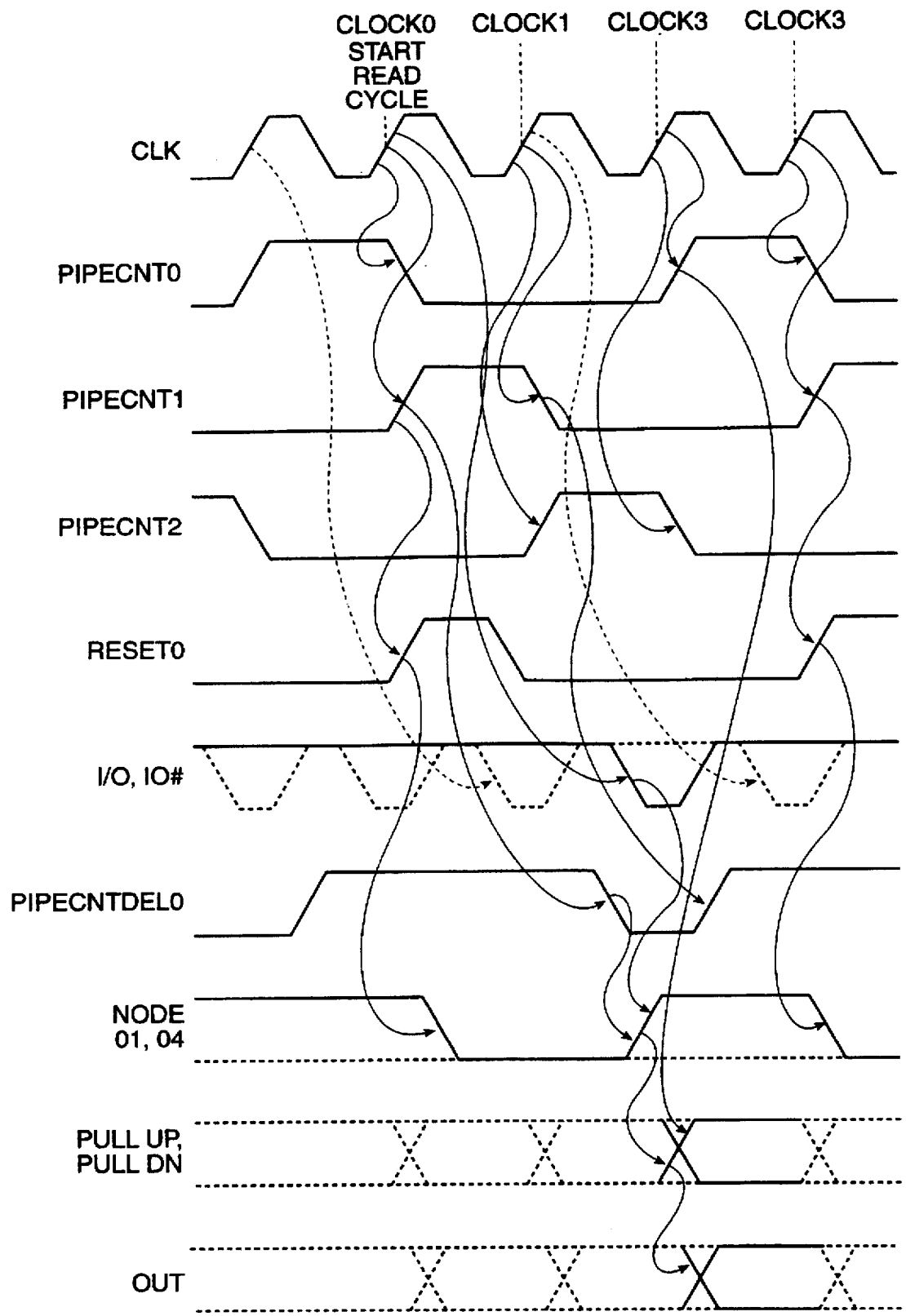
FIG. 4 is a timing diagram of the circuit of FIG. 2 for the case when a latency of three has been selected.

Referring now to FIG. 4, an example timing diagram for a latency of three is shown. For a latency of three, data will start to output two clocks after the start of a read cycle, which will permit higher frequency operation. This diagram again refers to circuit 200 of FIG. 2. The same circuit 200 may be used to achieve a latency of three by generating a different selection of which PIPECNTDEL signal is asserted by which PIPECNT signal.

FIG. 4 shows operation with a latency of three and a cycle time of about 5.5 ns. Again, the rising edge of the clock signal in FIG. 4 causes a transition between PIPECNT signals. Once again, the timing diagram shows data being steered to nodes N01 or N04 of branch 0 (i.e., the negative pulse on the I/O lines occurs during assertion low of the PIPECNTDEL0 signal). The combination of a low pulse on either I/O# or I/O and a low signal on PIPECNTDEL0 steers the data to set high either node N01 or N04 respectively. The selection of the PIPECNT0 signal causes transfer of this data to nodes PULLUP and PULLDN, continuing on to appear as output on pad 150 of the memory part. For a latency of three, however, PIPECNT0 does not occur until the second clock following the clock initiating the read cycle, i.e. clock 2. Note that PIPECNTDEL0 is asserted low a fixed time after the selection high of PIPECNT1 when the selected latency is three, whereas. PIPECNTDEL0 was asserted low the same fixed time after the selection high of PIPECNT2 for a latency of two. In one specific embodiment having a 10 ns asynchronous delay, the PIPECNTDEL0 signal will be asserted low 8.5 ns after selection of PIPECNT1 (while PIPECNT2 is simultaneously unasserted nigh).

Operation of the steering circuit 200 of FIG. 2 allows output data to be quickly and efficiently pipelined. High frequencies of operation are supported. Selection of an appropriate latency for a particular system allows a user or memory designer to optimize memory performance.

With a latency of two, data is output from the circuit 200 on the second clock after the start of a read cycle. That is, clock zero starts a read cycle, clock one selects the data from that read cycle to be output, and clock two latches the valid output data into a receiving circuit. The circuit 200 may be used to output data to any of a number of receiving circuits. For example, the data may be supplied to a cache system or a central processing unit. For an embodiment where the asynchronous delay between the start of a read cycle and the arrival of data on node N01 or N04 is 10 ns, and where the asynchronous delay through the output buffer is 5 ns, data can not become valid on the output earlier than 15 ns after the initiation of the read cycle. That is, the time between clock zero and clock two must be at least 15 ns for the correct data to be received by a receiving circuit. At a latency of two, the cycle time must therefore be greater than or equal to 7.5 ns. Note that with a 7.5 ns cycle time, PIPECNT0 calls for the new data one clock (or 7.5 ns) after the start of the read cycle, 2.5 ns before that data sets node N01 or N04 high. The output has no glitch, but instead starts to switch only when the data finally arrives at node N01 or N04, 2.5 ns after clock 1 selects this data for output. The data becomes valid at the output approximately 5 ns later by clock 2.

For a latency of three, on the other hand, data is latched into a receiving chip on clock number three. Again, as for a latency of two, data sets node N01 or N04 high after an asynchronous delay of 10 ns from the start of a read cycle, and can get through the output buffer in 5 ns. But at a latency of three, there are three clocks during this 15 ns time interval. Thus, each clock period can be as short as 5 ns. With this latency of three, and with a 5 ns cycle time, data is selected for output of clock number 2, 10 ns after the start of the read cycle. With node N01 or N04 set high after an asynchronous delay of 10 ns from clock 0, and PIPECNT0 selected by clock 2 also 10 ns after clock 0, data is valid at the output 5 ns later (i.e., at 15 ns). This is concurrent with the third clock, which latches the data into a receiving circuit (e.g., a CPU, cache, or the like).

The primary functional difference between operation at a latency of two and operation at a latency of three is the logical selection of which asserted PIPECNTDEL follows which selected PIPECNT. The choice determines the number of clocks which will occur before data is selected for output. Another difference is the control of which cycles have the output enabled.

As the clock frequency increases, the minimum useable latency also increases. For the above example, operation at a 5 ns cycle time requires a latency of (at least) three. Operation at a 7.5 ns cycle time requires a latency of (at least) two. Operation at a latency of one (using circuitry that will be presently described) will be seen to be possible for a cycle time of at least 15 ns. To minimize access time, the system designer should choose the smallest latency which will work with his target operating frequency. The efficient programmable latency of the present invention allows for a choice of latency, thus enabling a designer to optimize the system for particular needs. This flexibility is attained without compromising gains in other memory design parameters such as speed, power and substrate area.

Figure 5:
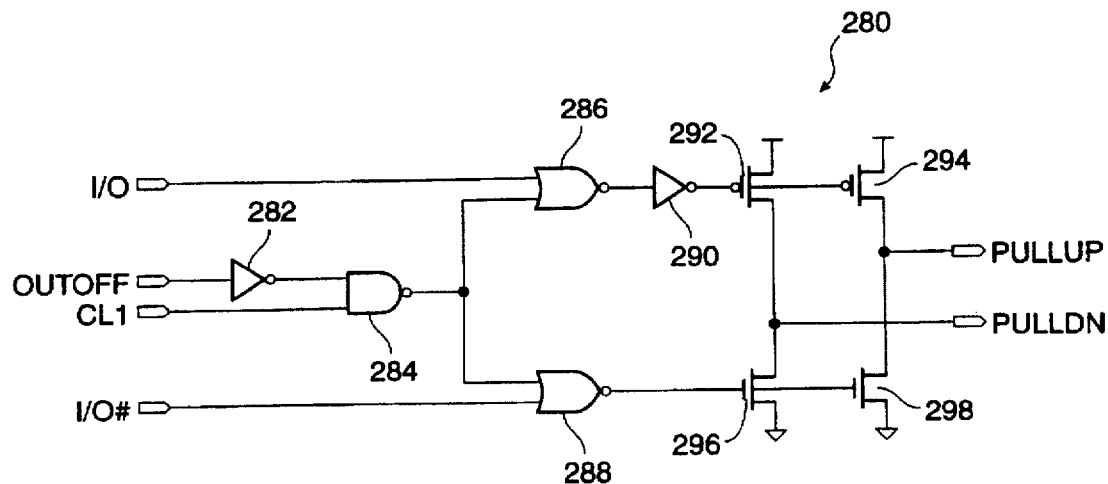
FIG. 5 is an alternative circuit for steering signals when a latency of one is selected.

In one specific implementation, the steering circuit 200 may be augmented with an additional circuit designed to support a latency of one. Referring now to FIG. 5, a circuit 280 is shown which may be used where a latency of one is desired. By using these circuits together on a single memory part, a user is able to select an even wider range of output latencies. Like circuit 200, circuit 280 drives the state of the signals PULLUP and PULLDN. Circuit 280 may be used when the system (or a designer) has opted to utilize a latency of one rather than two or higher. If the desired latency is greater than one, signal CL1 (Column Read Latency=1) is driven low and the output of NAND gate 284 is high, the outputs of both NOR gates 286 and 288 are low and the output of inverter 290 is high. All four of the transistors 292, 294, 296 and 298 are off. The circuit 280 is thereby disabled for latencies greater than one.

However, if a latency of one is desired, circuit 200 in FIG. 2 is disabled and circuit 280 of FIG. 5 is enabled. Operation of the circuit 280, when enabled, depends upon the state of input signal OUTOFF. If OUTOFF is a logic one, inverter 282 outputs a zero, NAND gate 284 outputs a one, and NOR gates 286, 288 output zeros. Transistors 292, 294, 296 and 298 are all off. This allows the circuit 300 of FIG. 6 to open circuit the output, as will be discussed. If OUTOFF is a logic zero and CL1 is a logic one, the output of NAND gate 284 is low, enabling circuit 280 by providing a low input to each of the NOR gates 286, 288. Again, data flows asynchronously through the memory providing a low pulse on either I/O or I/O#. If a low pulse is propagated on line I/O, NOR gate 286 will output a high pulse and, inverter 290 will output a low pulse turning on PMOS transistors 292, 294. This low pulse is of long enough duration to pull both PULLUP and PULLDN to Vcc. They will remain at Vcc (due to latches included in circuitry 300 of FIG. 6) until a subsequent cycle switches them. With both PULLUP and PULLDN at Vcc the output is driven to ground. Similarly, a low pulse on line I/O# will cause the output of a high pulse from NOR gate 288, thereby turning on NMOS transistors 296 and 298. This pulls both PULLUP and PULLDN to ground, driving the output to Vcc. PULLUP and PULLDN will remain at ground until switched high by a subsequent cycle.

Note that with a latency of one there is no pipelining. That is, as soon as data in the form of a negative pulse on I/O or I/O# occurs, that data continues asynchronously to the output. It does not wait for the arrival of a second or third clock before switching the output.

Signals PULLUP and PULLDN are used to drive an output signal OUT_TTL which may be coupled to an output pad of the memory device. In one specific embodiment, OUT_TTL is generated by an output circuit 300 of FIG. 6. This circuit 300 may accept the PULLUP and PULLDN signals output from circuit 280 of FIG. 5 (for a latency of one) and from circuit 200 of FIG. 2 (for latencies greater than one). When both PULLUP and PULLDN are driven to Vcc by either circuit 200 or 280, PMOS transistor 314 is off and NMOS transistor 318 is on so that the output is driven to ground. When both are driven to ground by either circuit 200 or 280 PMOS transistor 314 is on and NMOS transistor 318 is off so the output is driven to Vcc. Preferably, to drive an output pad quickly, both PMOS 314 and NMOS 318 have relatively large channel widths. For example, in one specific embodiment, PMOS 314 has a channel width of 400 μ and NMOS 318 has a channel width of 250 μ.

When OUTOFF is asserted high, the output of inverter 302 is low, turning on PMOS transistor 304. This pulls PULLUP to Vcc, turning PMOS 314 off. At the same time, NMOS 316 is turned on, pulling PULLDN to ground. This turns off NMOS transistor 318. With both transistors 314 and 318 turned off, the output is open circuited. Inverters 306 and 308 latch the state of PULLUP while inverters 310 and 312 latch the state of PULLDN, maintaining any given state indefinitely until new data arrives. Signal OUTOFF, essentially, functions as an output disable command serving to turn off both PMOS 314 and NMOS 318.

Thus, in the case where the selected latency is equal to one, as soon as a signal is generated on the I/O lines, it is placed on an output pad (OUT_TTL) without waiting for any additional clock. That is, the data flows asynchronously all the way to the output. When the selected latency is equal to two, output signals from a read cycle initiated by clock zero are placed on the output pad only after receipt of the next clock (i.e., clock one). When the selected latency is equal to three, output signals from a read cycle initiated by clock 0 are placed on the output pad only after receipt of clock 2. The result is an ability to selectively determine a latency for output from, e.g., a synchronous memory device. By selecting a high latency, the system is able to support very high frequencies of operation. The access time from start of a read cycle to output is fast because the data flows asynchronously all the way from the input to the steering provided by the PIPECNTDEL signals. The signal is not slowed down by passing through a sequence of intermediate transmission gates. Instead, the signal passes through a single (e.g., PMOS) steering gate. Yet the circuitry is relatively simple, and occupies little substrate area. When used in conjunction with a synchronous DRAM, for example, a system according to the present invention may provide the output pipeline function with a chip approximately the same size as an otherwise similar asynchronous DRAM.

Figure 7:
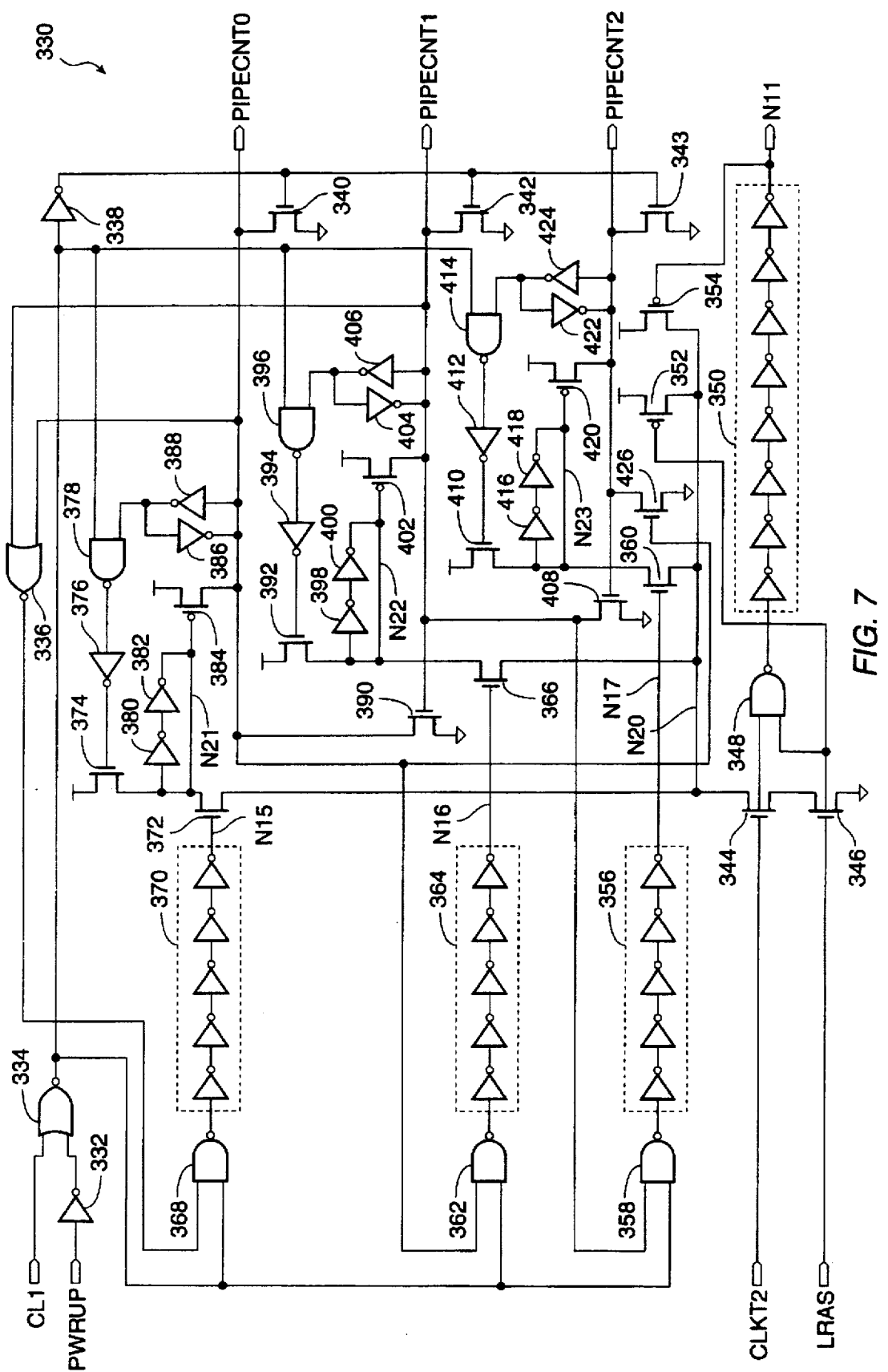
FIG. 7 is a pipecount generation circuit for generating pipecounts for use in the circuit of FIG. 2.

Reference will now be made to FIG. 7, where a PIPECNT generation circuit 330 is shown. The PIPECNT generation circuit 330 is used to generate pipecounts for the steering circuit 200 of FIG. 2. In general terms, the PIPECNT circuit 330 is a high-performance, divide-by-three, wrap-around, synchronous counter. The count modulus of three is chosen to support a specific maximum latency requirement, in this case three.

The circuit 330 includes an LRAS input which may be used, in one specific embodiment for use in a DRAM system, to disable the circuit if RAS is not active. This feature saves power during inactive RAS cycles, when no reading is possible. A low signal on line LRAS turns off NMOS transistor 346 and pulls node N20 high through PMOS transistor 352. This prevents the counter from advancing count, instead locking it at its existing count. However, when RAS is active, a high signal on LRAS enables circuit 330 by turning on NMOS transistor 346, enabling the count to advance with each new clock. The LRAS signal must remain active after RAS goes inactive for a number of cycles sufficient to output the data stored in the branches of circuit 200.

When a latency of one is utilized, the count circuit 330 is not needed. Thus, the circuit may be disabled by asserting a CL1 signal high. This causes NOR gate 334 to output a low signal. A logic zero is thus placed at one of the inputs of each NAND gate 368, 362 and 358. This ensures that nodes N15–N17 all remain low and that NMOS transistors 372, 366, and 360 are all off. At the same time, the low output of NOR gate 334 causes a high output of NAND gates 378, 396 and 414, their inverted outputs turning on PMOS transistors 374, 392 and 410. Thus, nodes N21, N22 and N23 are high, turning off PMOS transistors 384, 402 and 420. The output of inverter 338 provides a high input to NMOS transistors 340, 342 and 343. PIPECNT0, 1, and 2 all remain at ground to save power.

Further, if the memory device does not yet have a substrate bias (i.e., a power up signal has not yet been asserted high), the circuit 330 is disabled. This is accomplished by routing a pwrup signal thru an inverter 332 and to NOR gate 334, disabling the circuit 330 as just described for a latency of one. Those skilled in the art will recognize that latch-up could occur if the circuit was intended to operate only with a substrate bias (such as in a DRAM) but was permitted to operate before the substrate bias was generated.

The pipecount circuit 330 is, essentially, a self-starting synchronous counter with minimum delay from clkt2 to transitions on PIPECNT0, 1, or 2. Clkt2 is a short-duration positive pulse occurring quickly after the rising edge of the clock input. In the following, it will be assumed that LRAS is asserted high, CL1 is low, and pwrup is high. That is, circuit 330 is enabled. A count occurs as a result of the positive pulse on clkt2. At the rising edge of clkt2, NMOS transistor 344 turns on, pulling node N20 to ground. When NMOS transistor 344 turns on, the sources of NMOS transistors 360, 366 and 372 are pulled to ground. At this point, either node N15, N16, or N17 is high. For the purposes of explanation, assume that node N15 was high at the occurrence of clkt2. This would be the case if PIPECNT2 were selected high before receipt of clkt2 (PIPECNT0 and 1 low). A logic one at the gate of NMOS transistor 372 causes the transistor to be conductive, causing node N21 to quickly follow node N20 to ground. As will be discussed, PMOS transistor 374 is off at this time. A latch formed from inverters 380 and 382 ensures that node N21 stays in either state until forced to the opposite state. The latch is designed to be easily overpowered. The low at node N21 turns on very large PMOS transistor 384 to quickly select signal line PIPECNT0 high. Another latch formed from inverters 386, 388 maintains the high signal on PIPECNT0. When PIPECNT0 goes high, previously selected line PIPECNT2 is deselected low via a large NMOS transistor 426. This ensures a very fast transition from a count of, e.g., 2 to 0.

The high signal on PIPECNT0 causes a low output of inverter 388, causing a high output of NAND gate 378, causing a low output of inverter 376. After the small delay of these logic gates, PMOS transistor 374 is turned on. This takes place after the falling edge of the pulse on clkt2. As a result, PMOS transistor 374 resets node N21 high, turning off PMOS transistor 384 but only after PIPECNT0 has switched high. With PMOS transistor 384 off, PIPECNT0 can be quickly pulled to ground through NMOS transistor 390 at the next clock as PIPECNT1 goes high. The selection high of PIPECNT0 causes a logic one to be placed at the input to NAND gate 362. NOR gate 334 provides a one to the other input of NAND gate 362. NAND gate 362 will therefore output a logic zero. After a delay from inverter string 364 (the delay chosen to be greater than the width of the pulse on clkt2), node N16, the gate of NMOS transistor 366, will be pulled high in preparation for the next clock. Similarly, node N15, the gate of NMOS transistor 372, is pulled low before the next clock since PIPECNT0 was selected high, pulling the output of NOR gate 336 low. This next clock will not affect node N21 since transistor 372 is off. It will, however, pull node N22 low since transistor 366 is on. PMOS transistor 402 quickly selects PIPECNT1 high. The selection high of PIPECNT1 will cause NMOS transistor 390 to deselect PIPECNT0 low.

Fast positive transitions in the PIPECNT signals are achieved, in part, through the use of PMOS transistors 384, 402, and 420 with large channel widths (e.g., on the order of 1000 μ) to quickly pull up the relatively high capacitance associated with the wires and logic coupled to each of the PIPECNT signals. To further decrease delay, before these PMOS transistors start to pull the nodes high, their opposing NMOS transistors 390, 408, and 426 are already off. That is, for example, PMOS transistor 384 pulls PIPECNT0 high at a time PIPECNT1 (the gate of NMOS 390) is low. NMOS transistors 390, 408, and 426 are also provided with relatively large channel widths to achieve fast negative transitions. Also, these NMOS transistors conduct while their opposing PMOS transistors are already off, since the PMOS transistors were on for a limited-duration pulse. Further, to achieve fast operation, the capacitance on clkt2 is minimized by requiring clkt2 to drive only a single transistor, NMOS transistor 344. If the counter were to be implemented using three conventional NAND gates, one to generate each of the nodes N21, N22, N23, three separate NMOS and three PMOS transistors would be connected to node clkt2. This would significantly add to the capacitance of clkt2.

A very short delay between clock and selection of a new PIPECNT results in a very low access time from clock to output. As shown in the example timing diagrams of FIGS. 3 and 4, the signals produced by the pipecount circuit 330 have quick transitions, transitioning high only two inverter delays after clkt2 transitions high, which in turn is only two inverter delays after the externally received clock transistions high. Each signal PIPECNT0-PIPECNT2 is selected high for one clock cycle, and low for 2 clock cycles while the others take turns being selected. These signals are used in conjunction with the steering circuit 200 of FIG. 2 to select the data stored in a specific pair of latches, i.e., storage nodes N01 and N04 of branch 0, to appear as output data from a memory device. The pipecount circuit 330 is self-starting. If, in any cycle, PIPECNT0 and PIPECNT1 are both not selected, (whether or not PIPECNT2 is selected), NOR gate 336, NAND gate 368, delay 370 and transistor 372 will cause the selection of PIPECNT0 the next cycle. This is followed by PIPECNT1, PIPECNT2, PIPECNT0, PIPECNT1 etc., in subsequent cycles.

The PIPECNT signals are also used in conjunction with a pipecount delay circuit 440 which will now be described by referring to FIG. 8. As discussed in conjunction with FIGS. 1 and 2 above, the occurrence of two events is required to steer data from an I/O line of the present invention to set high one of storage nodes N01–N06. Specifically, a low pulse must appear on line I/O or I/O# and a single PIPECNT-DEL signal must be asserted low. If PIPECNTDEL0 is asserted low, data will be steered to node N01 or N04 of branch 0. If PIPECNTDEL1 or PIPECNTDEL2 is asserted low, data will be steered to nodes N02 or N05 or to nodes N03 or N06, of branch 1 or 2 respectively. The pipecount delay circuit 440 is used to ensure that the PIPECNTDEL signals occur at the proper time and steer to the proper branch. At high frequencies, this is a particularly difficult problem. In one specific embodiment, each of the PIPECNT-DEL signals increments about 8.5 ns after the start of read cycle and follows (inverted) a specific one of the PIPECNT outputs, depending on the chosen latency.

The pipecount delay circuit 440 generates the PIPECNT-DEL signals based upon several inputs, including information indicating the latency desired. If a latency of one is to be used, this entire circuit is not necessary and is, therefore, disabled. The circuit is disabled by the assertion of signal CL1 high. This causes inverter 442 to output a low signal, thereby turning on PMOS transistors 526, 528 and 530. It also forces NAND gate 444 to output a high signal, and inverter 446 to output a low signal, turning off NMOS transistors 514, 518, 522. A high output of inverter 448 turns off PMOS transistors 516, 520 and 524. With transistors 514 and 516 off and 526 on, the input of inverter 534 is high as are the inputs of inverters 538 and 542. This forces signals PIPECNTDEL0-2 to be held at their unasserted high level so that the steering circuit 200 never steers data from the I/O lines to nodes N01–N06. Rather, the alternate circuit of FIG. 5 may be enabled to asynchronously propagate data from the I/O lines to the output pad without waiting for any additional clock.

However, when latencies of two or three are used, a zero is input on line CL1. Further, a mode register or the like may be used to programmably specify a latency of either two or three. For example, in one specific embodiment, a logic zero on the mreg4 line selects a latency of two, while a logic one selects a latency of three. If a latency of two is selected, the upper half of the multiplexors formed from transistors 478/480, 486/488, and 494/496 will be enabled. If a latency of three is selected, the lower half of the multiplexors formed from transistors 482/484, 490/492, and 498/500 are enabled. Other selection schemes for use in an implementation having more branches may be employed to create circuits having a greater number of possible latencies. The memory design may be implemented in a manner allowing a user to change the latency of an installed part by overwriting a value in a mode register or the like.

Signals PIPECNT0 and PIPECNT1 are received from the PIPECNT circuit 330 of FIG. 7. A substitute PIPECNT2 signal is generated by NOR gate 564 and is selected high when neither PIPECNT0 or PIPECNT1 is selected high. Signals PIPECNT0, PIPECNT1, or PIPECNT2 change state very quickly after clkt2 pulses high to achieve fast access time from clock to output. The clkt2 pulse is delayed by inverter string 350 of FIG. 7, and further delayed by inverter string 562 of FIG. 8 to provide a positive pulse about 3.3 ns after clkt2. This delay tracks the asynchronous propagation delay of the data pulse through the memory portion of the circuit and is more or less equal to one-third of that delay. This pulse occurs after the PIPECNT signals have finished incrementing and terminates before they can increment again, 5 ns later. This positive pulse causes the new state of each PIPECNT output to be propagated through the multiplexors formed by transistor pairs 452/454, 456/458 and 460/462. Count data at the multiplexor outputs increments about 3.4 ns after the clkt2 signal has been input to the pipecount circuit of FIG. 7. Inverters 468, 472, and 476 propagate this new data to nodes N25, N26 and N27 about 0.1 ns later. That is, nodes N25–N27 follow the inverted transitions of PIPECNT0, 1, 2 with a 3.5 ns delay due to delays 350 and 562, as well as the delay through multiplexor 452/454 and inverter 468, etc. The signal passed through the multiplexors is maintained by the latches formed from inverter pairs 466/468, 470/472 and 474/476. The data at nodes N25–27 will asynchronously propagate to nodes N28–30, but which input N25–N27 generates a given output N28–N30 depends upon the latency selected. For example, if a latency of two has been selected, the signal from node N25 will pass to node N28. The signal on node N26 will pass to node N29 and the signal on N27 will pass to node N30. That is, signal PIPECNTDEL1 will be asserted low, after an appropriate delay, by the selection high of PIPECNT0. PIPECNTDEL2 will be caused by the selection of PIPECNT1 and PIPECNTDEL0 will follow PIPECNT2. When this signal arrangement is used in conjunction with the steering circuit 200 of FIG. 2, the result is that data is placed on the output pad 150 upon receipt of the first clock after the start of the read cycle, i.e., with a latency of two as shown in FIG. 3.

When a latency of three has been selected, the signals at nodes N25–N27 will pass through the lower half of the multiplexor. That is, data from node N25 will pass to node N29, data from node N26 will pass to node N30, and data from node N27 will pass to node N28. In this case, signal PIPECNTDEL1 will be asserted low by the selection of PIPECNT2 8.5 ns earlier. PIPECNTDEL2 will follow PIPECNT0 and PIPECNTDEL0 will follow PIPECNT1. This ensures that data is placed on the output pad by circuit 200 two clocks after the start of the read cycle, i.e., with a latency of three as shown in FIG. 4.

The effect of choosing differing latencies may be seen by referring to the timing diagrams of FIGS. 3 and 4. In FIG. 4, a latency of three has been chosen, and signal PIPECNTDEL0 has been asserted low by the selection high of signal PIPECNT1, 8.5 ns earlier. Clock 0 initiates this read cycle, clock 1 selects data from branch 2 (if available) and clock 2 selects data from branch 0 into which this read data is steered. Thus, the desired latency of three is achieved. In FIG. 3, a latency of two has been chosen, and signal PIPECNTDEL0 is asserted low by the selection high of signal PIPECNT2 8.5 ns earlier. In this case, clock 0 initiated the read cycle and steered the data into branch 0. Clock 1 selected this data in branch 0 for output, achieving a latency of two. This arrangement of signal paths allows a very efficient and simple selection between differing latencies. Of course, other logical means may be used to choose which PIPECNTDEL follows which PIPECNT. For example, combinatorial logic such as NAND or NOR gates may be used to select signals in a similar manner.

Once the appropriate signal has reached node N28, N29 or N30, it is then advanced through the remainder of the circuit using another set of multiplexors (formed from transistor pairs 514/516, 518/520, and 522/524), the timing controlled by the timing signal COUNTDEL. This timing signal is designed to assert the next PIPECNTDEL signal and to deassert the previously asserted PIPECNTDEL signal at an appropriate time after a read request has been made of the memory. In the preferred embodiment, these signals transition slightly before data arrives on the I/O lines when operated at high frequencies, accurate timing is absolutely essential. The following circuitry provides the accurate timing required for this system. One specific embodiment of a timing circuit 600 for generating a COUNTDEL signal is shown in FIG. 9.

The PIPECNTDEL signals, used to steer I/O data into the various branches of circuit 200 (FIG. 2), requires accurate timing. This timing must be coordinated to occur in conjunction with the negative data pulses on the I/O lines. When a column decoder output (of a DRAM) is selected, access transistors couple bit and bit# lines of the selected column to local I/O and I/O# lines which had been previously equilibrated to the same voltage. One of the bit or bit# lines is high and the other is low. The resulting differential conduction to nodes at different voltages causes a differential voltage to be slowly developed between the true and compliment local I/O lines. After sufficient analog signal is developed, a dynamic differential sense amplifier 622 strobes the data represented by this differential voltage. The sense amplifier strobe is a narrow pulse, causing the sense amplifier to output a narrow negative pulse on either the true or compliment (global) I/O line, depending on the polarity of the differential voltage received from the local I/O and I/O#. It is important to wait long enough before strobing the sense amp to have sufficient signal for reliable operation. Yet it is important to not wait longer than necessary as this would add to the address access time of the memory. To achieve accurate sense amp strobe timing, this timing is made to follow, as closely as practical, a fixed delay after assertion of the selected column, the signal that causes the local I/O differential signal to develop. In one specific embodiment, this fixed delay is controlled using a circuit 600.

The timing circuit 600, in one specific embodiment, accepts eight predecoder outputs, GYA0–GYA7, which are OR'd together in a logical NOR circuit consisting of four NOR gates 602–608, two NAND gates 610, 612 followed by a single NOR gate 614. Those skilled in the art will realize that it is not practical to OR the outputs of the many column decoders to generate the sense amp strobe timing signal. It is, however, practical to OR together one set of eight one-of-eight predecode outputs, one of which pulses high slightly before the final column decoder output pulses high. Those skilled in the art will also recognize that a logical NAND circuit may also be used to detect the signal in the predecode lines if the selected line pulses low instead of high.

When any of the global Y-addresses pulses high, the output of one of the NOR gates 602–608 pulses low, causing either NAND gate 610 or 612 to pulse high thereby forcing NOR gate 614 to produce a low pulse output. Prior to this, the output of NOR gate 614 had been high and the output of inverter chain 616 had been low. Thus when the output of NOR gate 614 transitions low, for a short period (equal to the delay of inverter chain 616), NOR gate 618 outputs a high pulse. This pulse may be, e.g., a 1 ns wide pulse. This narrow pulse is chosen to permit a narrow data pulse on the I/O lines. The narrow data pulse on the I/O lines improves timing margins as will be discussed. The leading edge of this pulse may occur four logic delays after assertion of one of the predecoder inputs, approximately coincident with the assertion of a final column decode.

The positive pulse on the output of COUNTDEL is buffered and logically selected to strobe only selected sense amps of selected memory arrays by buffer and selection logic 620. Since the sense amplifier strobe is asserted by the same signal (one of GYA0–GYA7) that asserts a column, its timing relative to column selection is very good. The sense amplifier strobe signal is generated about 2.5 ns after the column is asserted to allow time for the differential signal to develop. After the delay of the sense amplifier and its output buffer, a 2 ns wide negative data pulse on either the true or compliment (global) I/O line occurs approximately 4 ns after the positive pulse on COUNTDEL.

As previously discussed, the PIPECNTDEL signals must be advanced with very accurate timing. To achieve the required timing accuracy, two separate concepts are employed. First, the data on the I/O occurs as a pulse as short in duration as possible. This short pulse maximizes the window of time during which PIPECNTDEL can be incremented without incurring errors. This window is 3 ns wide for a 2 ns pulse and a 5 ns cycle time. If the sense amplifier were to instead output a logic level (as contrasted to a pulse), the PIPECNTDEL would have to increment at exactly the same time as the data increments, leaving no margin for error. And secondly, the same COUNTDEL signal that sets the sense amp strobe timing (generating the negative pulse on either I/O or I/O#) is also used to set the timing of the advance of the PIPECNTDEL signals. Of course, a signal other than COUNTDEL could be used. What is important for proper steering of the data is that the same signal be used to both generate the I/O pulse and to advance the PIPECNTDEL.

Referring again to FIG. 8, it is seen that the COUNTDEL pulse is used to operate NAND gate 444. If a latency of one has not been selected and if the COUNTDEL signal pulses high, NAND gate 444 will output a negative pulse, which is then inverted by inverter 446. Thus, a positive pulse of perhaps 1 ns duration is generated at the output of inverter 446. This positive pulse causes the multiplexors formed from transistor pairs 514/516, 518/520 and 522/524 to propagate the data from nodes N28–N30 through to become signals PIPECNTDEL1, 2, or 0. That is, if PIPECNTDEL0 is to be asserted low, a logic zero will be output from NAND gate 512, propagated (at a specific time) through the multiplexor formed from transistors 522 and 524, latched by inverter latch 540/542, buffered by inverters 542–560, and output as PIPECNTDEL0. The total delay from COUNT-DEL to PIPECNTDEL0 (or PIPECNTDEL1 or 2) is about 2.5 ns. This is the delay through NAND gate 444, inverter 446, NMOS transistor 522, and inverters 542, 556, 558, and 560. This 2.5 ns delay is specifically chosen to be less than the 4.0 ns delay from COUNTDEL to the leading edge of the narrow I/O data pulse. The PIPECNTDEL signals are thus incremented slightly before the I/O lines pulse low. The PIPECNTDEL signals are of relatively long duration and remain valid for a full clock cycle time. This serves to create a window within which the I/O pulse can arrive.

The timing at the various nodes of one specific embodiment of the circuit 440 of FIG. 8 may be summarized as follows. PIPECNT0, 1, 2 advance quickly after each rising edge of a clock. Multiplexors 452/454 etc., are enabled about 3.3 ns after the rising edge of the clock. The outputs of NAND gates 504–512 increment about 1.2 ns after the multiplexors 452/454 etc. are enabled, or about 4.5 ns after the rising edge of the clock. In a separate path, signal COUNTDEL pulses positive, rising approximately 6 ns after assertion of the clock, and falling 1 ns later. Inverter 446 outputs a positive 1 ns wide pulse starting 6.5 ns after the clock. At this time, multiplexors 514/516 etc. are enabled to pass the data from NAND gates 504, 508, 512 that became valid 2.0 ns earlier (4.5 ns after the clock). Finally the PIPECNTDEL outputs increment 2 ns after multiplexors 514/516 etc. are enabled, 8.5 ns after the clock. Most importantly, they increment 1.5 ns before arrival of the 2 ns wide I/O pulse. For a 5 ns cycle time the PIPECNTDEL signal increments again 5 ns later, or about 1.5 ns after the end of the 2 ns-wide data pulse. Thus, at 5 ns cycle time, each PIPECNTDEL is valid, asserted or deasserted, for a full 1.5 ns on both sides of an I/O data pulse to properly steer I/O data. The narrow 2 ns wide data pulse maximizes this 1.5 ns timing margin. This pulse is 2 ns wide rather than perhaps 1 ns wide due to the rather slow rise and fall times at the far end of a resistive I/O line. Similarly, the output of inverters 504–512 are valid a full 2 ns on both sides of the 1 ns wide pulse at the output of inverter 446. The arrival of the data at the outputs of NAND gates 504, 508, 512 could therefore be early or late by 2 ns with no change in the timing of PIPECNTDEL. These margins allow coordination of the timing of the PIPECNTDEL signals, and also make this method of pipelining practical.

Figure 8:
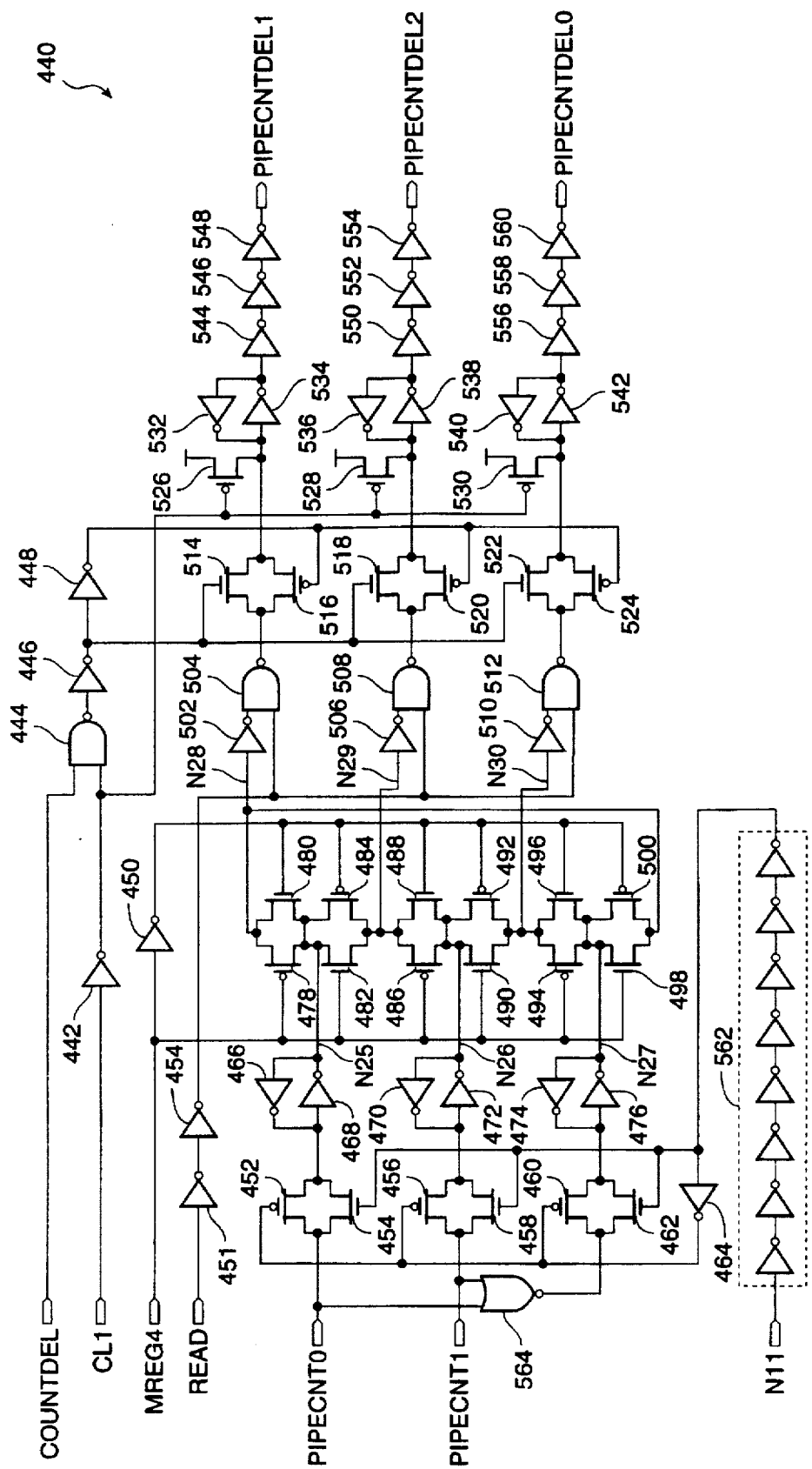
FIG. 8 is a pipecount delay circuit for generating delay signals for use in the circuit of FIG. 2.
Figure 9:
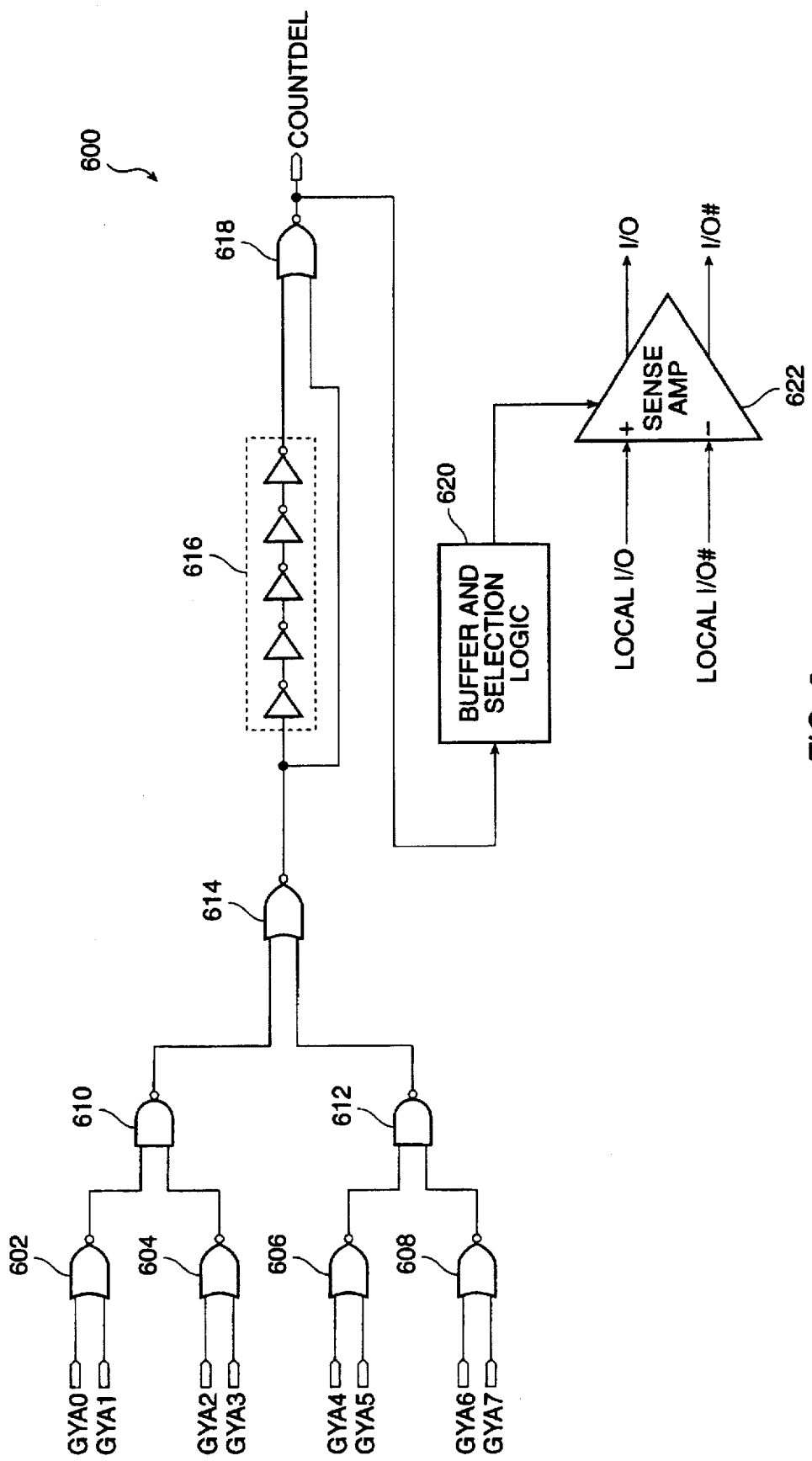
FIG. 9 is a count delay generation circuit for creating a timing signal for use in conjunction with one embodiment of the present invention.

In one specific embodiment of the circuit 440 of FIG. 8, a read signal may be used to disable the outputs of NAND gates 504, 508, and 512. That is, if the read cycle is not active, a low signal placed on signal line READ will ensure that all of the NAND gates 504, 508 or 512 output a logic one. No PIPECNTDEL signals will be asserted low, and, thus, no power will be consumed switching these signals.

Figure 10:
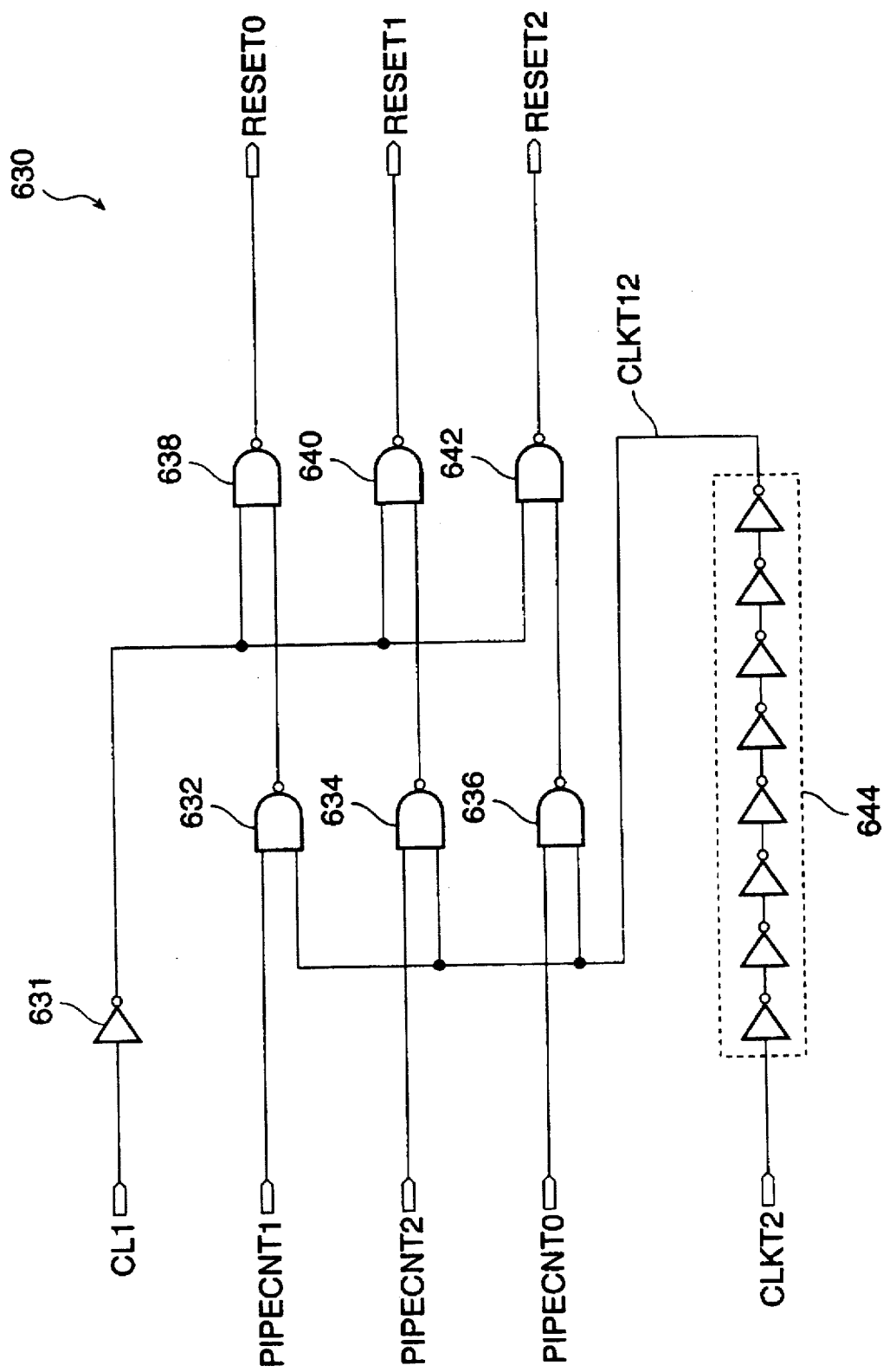
FIG. 10 is a reset generation circuit for use in resetting the circuit of FIG. 2.

Referring now to FIG. 10, one specific embodiment of a reset circuit 630 according to the present invention is shown. The pipeline reset circuit 630 is employed to generate the RESET0-2 signals which are input to the steering circuit 200 of the present invention. The RESET0 signal (positive pulse) will reset nodes N01 and N04 of circuit 200 (FIG. 2) low and node N013 high. This reset for branch 0 occurs early in the cycle following the cycle outputting data from branch 0. That is, it occurs immediately after branch 0 is no longer selected for output, early in the cycle selecting branch 1 for output. But the RESET pulse terminates before new data is steered into branch 0 from I/O or I/O#. Circuit 630 is driven by clock signal clkt2 which, as previously described, outputs a positive pulse early in the cycle. Delay is added by an inverter chain 644. The number of inverters of the chain is selected to ensure that the reset signals are generated after the pipecount has advanced to the next count. For example, storage nodes N01 and N04 of circuit 200 of FIG. 2 need to be reset low at some point after PIPECNT0 is unselected but the reset must terminate before new data is steered by PIPECNTDEL0 to set node N01 or N04 high. In one specific embodiment, the reset circuit 630 is coordinated such that the positive pulse at the output of inverter string 644 occurs perhaps 3 ns after receipt of the clock. At this time, one of the signals PIPECNT0, 1 or 2 will have just been selected high. Thus, the output of one of the NAND gates 632–636 will pulse low. For example, if PIPECNT1 has just been selected high, NAND gate 632 will output a low pulse and RESET0 will output a high pulse, this pulse terminating before new data is steered into branch 0. The other RESET signals (1 and 2) do not produce a reset pulse this cycle. In a similar fashion, the selection of a PIPECNT2 signal will lead to the generation of a RESET1 signal and the selection of a PIPECNT0 signal will produce a RESET2 signal. The relative timing of generation of the RESET signals may be modified. However, each RESET signal must occur after its branch is no longer selected for output and terminate before new data arrives at its branch.

When a latency of 1 has been selected, inverter 631 provides a low output and each RESET0-2 will have a high output. In this case, all nodes N01, N02, N03, N04, N05, and N06 of disabled circuit 200 of FIG. 2 remain reset low. No reset signals change voltage, thereby conserving power.

Figure 6:
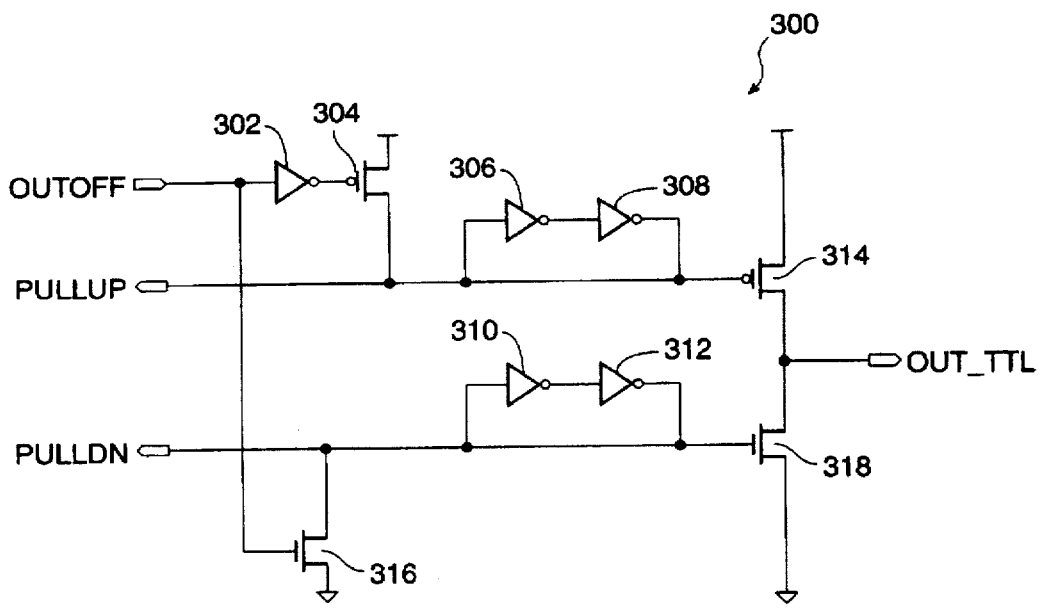
FIG. 6 is an output circuit for propagating the outputs of the circuits of FIGS. 2 and 5 to output pads.

Most memory circuits have a requirement that the outputs be open circuited at times, for example, when other similar memory chips in parallel with this chip are selected. The logic to determine whether a given clock cycle is to output data, or is to provide an open circuit condition, is known to those skilled in the art. For the purpose of the present invention, it is necessary that this information become valid before the start of the cycle in which it is to take effect. A signal, called OUTEN (output enable), when asserted (high) at the end of a cycle causes the next valid data to be output on the next clock as already described. However, if disabled, OUTEN causes the outputs to quickly open circuit upon receipt of the next clock. To achieve an open circuit output, OUTOFF in circuit 300 of FIG. 6 is asserted high. This high level is inverted by inverter 302 to produce a low input to PMOS transistor 304. This pulls node PULLUP high, turning off output PMOS transistor 314. The high level on OUTOFF turns on NMOS transistor 316 to pull node PULLDN low, turning off output NMOS transistor 318. With transistors 314 and 318 off, the output is open circuit.

To save power, it is necessary that no transistor tries to pull PULLUP low or PULLDN high during this output disable cycle. Returning momentarily to circuit 200 of FIG. 2, when PIPECNT advances (say from PIPECNT0 to PIPECNT1) PIPECNT1 quickly selects high turning off PMOS transistors 230A and 244A of branch 0 and PIPECNT0 quickly deselects low turning off NMOS transistors 234A, 226A and 240A also of branch 0. That is, the previously selected branch 0 of circuit 200 is prevented from continuing to pull PULLUP low or PULLDN high. But it is further required that no data from branch 1, during PIPECNT1 selection, tries to pull PULLUP low or PULLDN high during this output disable cycle. This is achieved by maintaining PCNT1 low during this output disable cycle even though PIPECNT1 is selected high. PIPECNT1 must be selected high to turn off PMOS transistors 230A and 244B of the previously selected branch as just described. In a cycle with an open circuit output, all PCNT0-2 are low even though one of signals PIPECNT0-2 is selected high.

Figure 11:
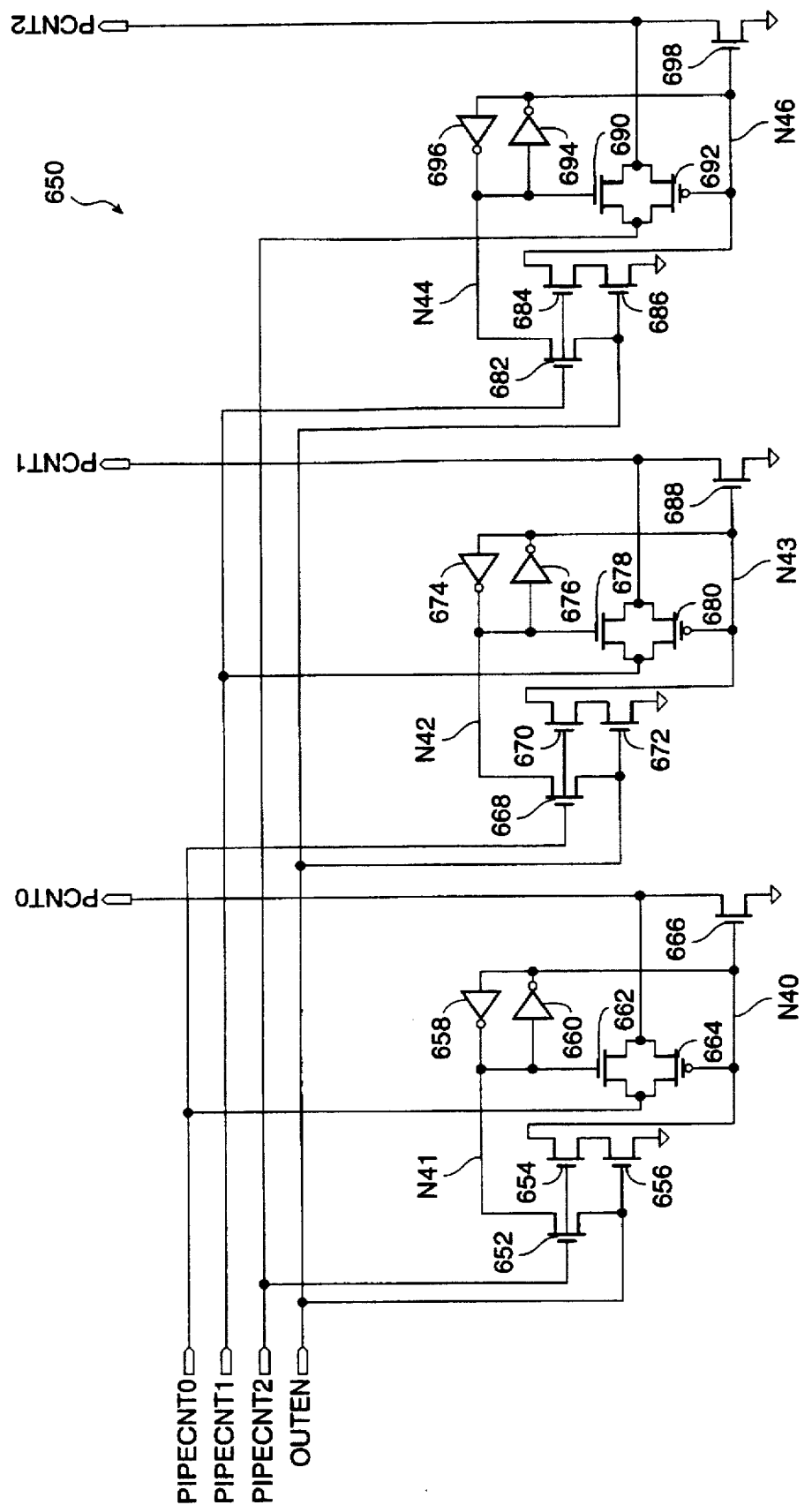
FIG. 11 is a pipeline enable circuit for use in conjunction with the circuit of FIG. 2.

The PCNT0-2 signals are derived from the PIPECNT0-2 signals in circuit 650 of FIG. 11. As will be discussed, if OUTEN is high at the end of one cycle, signals PCNT0-2 will follow signals PIPECNT0-2 respectively high on the next clock. This provides the operation previously described for a latency greater than one. However, if OUTEN is low at the end of one cycle, signal PCNT0-2 will remain low when its corresponding signal PIPECNT0-2 is selected high the following cycle.

At the end of a cycle in which PIPECNT0 is selected high, OUTEN is either high or low to respectively enable or disable the output for the following cycle. If OUTEN is low and PIPECNT0 is high, transistor 668 overpowers small inverter 674 and pulls node N42 low. At this time NMOS transistor 672 is off, and inverter 676 drives node N43 high. Inverters 674 and 676 latch and maintain this condition after PIPECNT0 transitions low. If, instead, OUTEN is high with PIPECNT0 high, NMOS transistors 670 and 672 are both on, overpowering inverter 676 and pulling node N43 to ground. Inverter 674 drives node N42 high, latching and maintaining this condition after PIPECNT0 transitions low. Thus, when PIPECNT0 goes low at the next clock, the latch comprised of inverters 674 and 676 can no longer change state but instead maintains the data representative of the value of OUTEN just prior to PIPECNT0 switching low.

If OUTEN was low when PIPECNT0 transitioned low (to disable the output when PIPECNT1 was asserted) node N42 is low and N43 is high. With N42 low, NMOS transistor 678 is off and with N43 high, PMOS transistor 680 is also off. Therefore, there is no connection between PIPECNT1 and PCNT1. At the same time, with N43 high, NMOS transistor 688 is on, keeping PCNT1 low. Thus with OUTEN low at the end of the preceding cycle, PCNT1 does not follow PIPECNT1 high in the following cycle, so no new data appears from branch 1 at the output of circuit 200 (FIG. 2). As PIPECNT1 goes high, other circuits not shown drive OUTOFF of circuit 300 (FIG. 6) high. This drives PULLUP high and PULLDN low to open circuit the output.

If, on the other hand, OUTEN is high at the end of the previous cycle (when PIPECNT0 was high), then node N42 is high and node N43 is low (FIG. 11). In this case, transistors 678 and 680 are on and transistor 688 is off. Therefore, PCNT1 follows PIPECNT1 high, and at the end of the next cycle, follows PIPECNT1 low (PIPECNT0 still being low). With PCNT1 selected high, the data from the set storage node N02 or N05 of circuit 200 (FIG. 2) drives nodes PULLUP and PULLDN both up or both down to output data. In a similar manner, PCNT0 and 2 either do or do not follow PIPECNT0 and 2, respectively, when they are selected.

Thus, circuit 650 offers an efficient and compact circuit for either enabling a branch of circuit 200 to provide output data when its PIPECNT signal is selected or for disabling the branch when its PIPECNT signal is selected.

While the above is a complete description of a particular embodiment of the present invention, various modifications may be employed. For example, the system may be provided with another circuit branch, allowing production of output from a memory system with a latency of from one to four. Further still, the circuitry described herein may be replicated to support any of a number of latencies. The pipeline may be used in conjunction with a number of synchronous memory products. The circuit could be adapted to function with active low or active high signals. The circuit could also be adapted to be positive and/or negative edge triggered. Although specific channel widths have been set forth in several instances, these parameters have merely been intended as relating to one specific embodiment according to the present invention. Those skilled in the art, upon reading this disclosure, will be able to vary channel widths and transistor types to suit a particular need.

Accordingly, the disclosure of the invention is intended to be illustrative, but not limiting, of the scope of the invention which is set forth in the following claims.

What is claimed is:

1. An integrated circuit having a data path with an output, comprising:
   a clock input coupled to receive a clock signal;
   a register having a plurality of branches for storing data;
   a steering circuit having an input coupled to a data line that carries data, said steering circuit being coupled to said register and sequentially steering said data into selected ones of said plurality of branches of said register in response to a first signal triggered by said clock signal; and
   a branch selection circuit coupled to said register, said branch selection circuit sequentially coupling data stored in selected branches of said plurality of branches to the output in response to a second signal triggered by said clock signal,
   wherein, a second data starts propagating through the data path after a first data starts propagating through the data path but before said first data reaches the output.

2. The circuit of claim 1 wherein said data is in the form of a pulse.

3. The circuit of claim 1 wherein each of said branches further includes a first and a second latch, wherein said first latch is responsive to a logic "1" and said second latch is responsive to a logic "0".

4. The circuit of claim 1 further comprising a memory array having addressable data storage locations, said memory array being coupled to said data line.

5. The circuit of claim 4 wherein said memory array comprises random access memory.

6. The circuit of claim 4 wherein said memory array comprises non-volatile memory.

7. The circuit of claim 1 further comprising a counter coupled to said steering circuit and said branch selection circuit, said counter producing an output count, said output count changing in response to said clock signal.

8. The circuit of claim 7 wherein
   a first count state from said counter is generated by a first event of said clock signal, said first count state causing said steering circuit to steer said first data into said selected one of said plurality of branches of said register;
   a second count state from said counter is generated by a second event of said clock signal, said second count state causing said steering means to steer said second data into a second selected one of said plurality of branches of said register;
   a third count state from said counter is used by said selection circuit to select for output said first data stored in said selected branch; and
   a fourth count state from said counter is used by said selection circuit to select for output said second data stored in said second selected branch.

9. The circuit of claim 8 wherein said third count state occurs at the same clock cycle as said second count state.

10. The circuit of claim 8 wherein said third count state occurs at some clock cycle after said second count state.

11. The circuit of claim 7 wherein said counter is a self-starting wrap-around counter having a clock input.

12. The circuit of claim 11 wherein said counter changes an output count in response to an edge of a signal applied to a gate terminal of a single transistor.

13. The circuit of claim 12 wherein said gate terminal of said single transistor couples to said clock input.

14. The circuit of claim 13 wherein said single transistor couples to a plurality of nodes and causes a change in output count by pulling one of said plurality of nodes to a logic level without an opposing pull.

15. The circuit of claim 7 wherein
   a first steer count state from said counter is generated by a first event of said clock signal, said first steer count state causing said steering circuit to steer data into said selected one of said plurality of branches of said register, and
   a first select count state from said counter is generated by a subsequent event of said clock signal, said first select count state causing said branch selection circuit to select for output said data stored in said selected one of said plurality of branches, said subsequent event of said clock cycle occurring some number of clock cycles after said first event of said clock signal.

16. The circuit of claim 15 wherein said number of clock cycles is one.

17. The circuit of claim 15 wherein said number of clock cycles is two.

18. The circuit of claim 15 wherein said number of clock cycles may be programmably set.

19. The circuit of claim 15 wherein said number of clock cycles may be programmably set as one or two.

20. The circuit of claim 15 wherein said number of clock cycles may be programmably set as zero, one or two.

21. The circuit of claim 15 wherein said number of clock cycles may be greater than one.

22. The circuit of claim 15 wherein said number of clock cycles may be programmable set as greater than one.

23. The circuit of claim 15 wherein said steering circuit comprises a plurality of logic circuits corresponding to said plurality of branches of said register, wherein each one of said plurality of logic circuits comprises:
   a first logic sub-circuit having a first input receiving data from said data line and a second input receiving a steer count state from said counter, said first logic sub-circuit performing one of a logical AND or NAND function on said data and said steer count state; and
   a second logic sub-circuit having a first input receiving data-bar, said data-bar being a complement of said data, and a second input receiving said steer count state from said counter, said second logic sub-circuit performing one of a logical AND or NAND function on said data-bar and said steer count state.

24. The circuit of claim 23 wherein each branch of said register comprises:
   a first latch coupled to an output of a first logic sub-circuit of a corresponding logic circuit of said steering circuit; and
   a second latch coupled to an output of a second logic sub-circuit of said corresponding logic circuit of said steering circuit.

25. The circuit of claim 24 wherein each one of said first latch and said second latch in each branch of said register further comprises a reset transistor having an input coupled to a reset signal.

26. The circuit of claim 25 wherein said register comprises first and second branches and said steering circuit comprises first and second logic circuits respectively coupled to said first and second branches, and wherein, said first logic circuit receives said first steer count state as an input, and said second logic circuit receives a second steer count state as an input, said second steer count state being generated by a second event of said clock signal after said first event.

27. The circuit of claim 26 wherein said register further comprises a third branch and said steering circuit further comprises a third logic circuit respectively coupled to said third branch, and wherein, said third logic circuit receives as an input a third steer count state from said counter, said third steer count state being generated by a third event of said clock signal after said second event.

28. The circuit of claim 26 wherein said branch selection circuit comprises first and second logic circuits respectively coupled to said first and second branches of said register, wherein each one of said first and second logic circuits comprises:

a first logic sub-circuit having a first input receiving an output of a first latch in a corresponding branch, and a second input receiving a select count state from said counter, said first logic sub-circuit performing one of a logical AND or NAND function on said output of said first latch and said select count state; and a second logic sub-circuit having a first input receiving an output of a second latch in said corresponding branch, and a second input receiving said select count state from said counter, said second logic sub-circuit performing one of a logical AND or NAND function on said output of said second latch and said select count state.

29. The circuit of claim 28 wherein said first logic circuit in said selection circuit receives said first select count state occurring one clock cycle after said first event of said clock signal, and said second logic circuit in said selection circuit receives a second select count state occurring two clock cycles after said first event of said clock signal.

30. The circuit of claim 27 wherein said branch selection circuit comprises first, second and third logic circuits respectively coupled to said first, second and third branches of said register, wherein each one of said first, second and third logic circuits comprises:

a first logic sub-circuit having a first input receiving an output of a first latch in a corresponding branch, and a second input receiving a select count state from said counter, said first logic sub-circuit performing one of a logical AND or NAND function on said output of said first latch and said select count state; and a second logic sub-circuit having a first input receiving an output of a second latch in said corresponding branch, and a second input receiving said select count state from said counter, said second logic sub-circuit performing one of a logical AND or NAND function on said output of said second latch and said select count state.

31. The circuit of claim 30 wherein said first logic circuit in said selection circuit receives said first select count state occurring two clock cycles after said first event of said clock signal, said second logic circuit in said selection circuit receives a second select count state occurring three clock cycles after said first event of said clock signal, and said third logic circuit in said selection circuit receives a third select count state occurring four clock cycles after said first event of said clock signal.

32. A memory circuit comprising:

an array of addressable memory cells for storing data;

a data line coupled to said array of memory cells;

a clock input coupled to receive a clock signal, a first edge of said clock signal initiating a first read cycle to supply an output data on said data line;

a register having a plurality of branches for storing data;

a counter producing a plurality of steer count states and select count states, said plurality of steer count states and select count states changing with cycles of said clock signal;

a steering circuit coupled to said register and said data line, said steering circuit further receiving said plurality of steer count states, said steering circuit steering said output data into a selected one of said plurality of branches of said register; and selection circuitry, driven by said plurality of select count states, for selecting for output said output data stored in said selected branch, wherein, said steering circuit steers a first output data into a first branch of said register in response to a first steer count state triggered by said first edge of said clock signal, and said selection circuity selects said first output data for output in response to a first select count state triggered by a second edge of said clock signal occurring a number of cycles after said first edge of said clock signal.

33. The circuit of claim 32 wherein each of said branches further includes a first and a second latch, wherein said first latch is responsive to a logic "1" and said second latch is responsive to a logic "0".

34. The circuit of claim 33 wherein said first and second latches are reset at the start of a read cycle.

35. The circuit of claim 32 further comprising disable circuitry for disabling an output of said circuit.

36. The disable circuitry of claim 35 wherein each of said branches are prevented from being selected for output when the output of said circuit is disabled.

37. The circuit of claim 32 further comprising a timing circuit controlling a timing of said plurality of steer count states in relation to a timing of outputting of a data pulse on said data line.

38. The circuit of claim 37 wherein said first steer count state is a pulse of longer duration than said data pulse on said data line.

39. The circuit of claim 37 further comprising a sense amplifier having a strobe input, and an output coupled to said data line, wherein said sense amplifier generates said data pulse on said data line by being strobed based upon said delay signal.

40. The circuit of claim 37 wherein said data pulse is a narrow pulse relative to the minimum cycle time of said memory circuit.

41. The circuit of claim 32 wherein said steering circuit further comprises:

a latency choice input for choosing between a latency of two and a latency of three; and path selection means, responsive to said latency choice, for selecting a path for said steering signal.

42. The circuit of claim 41 wherein said path selection means comprises a multiplexor.

43. The circuit of claim 41 wherein for latency choice of two said number of cycles equals 1, and for a latency choice of three said number of cycles equals 2.

44. The circuit of claim 41 wherein said counter cycles between three count states.

45. The circuit of claim 41 further comprising an additional circuit for outputting data with a latency of one.

46. The circuit of claim 45 wherein said steering circuit is disabled when a latency of one is chosen.

47. The circuit of claim 45 wherein said additional circuit is disabled when a latency of two or greater is chosen.

48. An integrated circuit comprising:

a clock input adapted to receive a clock signal;

a counter generating steer count states and select count states in response to said clock signal;

a register having first, second and third branches for storing data;

a steering circuit having a first input receiving data from a data line and first, second and third steer control inputs respectively receiving steer count states from said counter, said steering circuit being coupled to said register and sequentially steering data into a selected one of said first, second and third branches of said register in response to said steer count states from said counter; and a branch selection circuit having first, second and third data inputs respectively coupled to outputs of said first, second and third branches of said register, and first, second and third select control inputs respectively receiving select count states from said counter, said branch selection circuit coupling data stored in a selected branch of said first, second and third branches to an output node in response to said clock signal.

49. The circuit of claim 48 wherein a first data is generated by a first event of said clock signal, said first data is steered by said steering circuit into said first branch of said register in response to a first steer count state, said first steer count state being triggered by said first event of said clock signal, and said first data is selected for output by said branch selection circuit in response to a first select count state, said first select count state being generated by a second event of said clock signal, said second event of said clock signal occurring a number of cycles after said first event of said clock signal.

50. The circuit of claim 49 wherein said counter further comprises programming circuitry receiving at an input program information, and wherein said number of cycles is programmably set by said programming circuitry to one of 0, 1, and 2 in response to said program information.

51. A method for pipelining data in a synchronous memory system having a data path with an output, a register with a plurality of branches for storing data, and a clock input receiving a clock signal, the method comprising the steps of:

receiving a first clock edge on said clock input, said first clock edge initiating a first read cycle producing first data;

propagating said first data through the data path;

steering said first data produced by said first read cycle into a first one of said plurality of branches of said register;

receiving a second clock edge on said clock input, said second clock edge initiating a second read cycle producing second data;

propagating said second data through the data path before said first data reaches the output; and steering said second data produced by said second read cycle into a second one of said plurality of branches of said register.

52. The method of claim 51 wherein said system further comprises:

a wrap-around counter having at least three outputs, one of which is asserted during a given cycle; and a disable circuit receiving a disable signal, said disable circuit having at least three outputs;

wherein said at least three outputs of said disable circuit follow said at least three outputs of said counter unless said disable signal is asserted.

53. The method of claim 51 wherein each of said branches further includes a first and a second latch, wherein said first latch is responsive to a logic "1" and said second latch is responsive to a logic "0".

54. The method of claim 53 wherein said first and second latches of a particular branch are reset before data is steered into said particular branch.

55. The method of claim 51 further comprising the step of:

selecting, upon receipt of said second clock edge, said first data for output.

56. The method of claim 55 further comprising the step of:

disabling said first data for output upon receipt of a third clock edge.

57. The method of claim 51 further comprising the steps of:

receiving a third clock edge on said clock input, said third clock edge initiating a third read cycle producing third data;

propagating said third data in the data path before said first data reaches the output;

steering said third data produced by said third read cycle into a third one of said plurality of branches of said register; and selecting, by receipt of said third clock signal, said first data for output.

58. The method of claim 57 further comprising the step of:

disabling, upon receipt of a fourth clock edge, said first data for output.

59. A method for pipelining data in a circuit having a data path with an output, the method comprising the steps of:

initiating propagation of a first data along the data path;

initiating propagation of a second data along the data path after initiating propagation of said first data and before said first data reaches the output;

steering said first data into a first storage element;

steering said second data into a second storage element after said step of steering said first data;

selecting said first data in said first storage element for output; and selecting said second data in said second storage element for output after said step of selecting said first data.

60. The method of claim 59 wherein said first storage element and said second storage element are located at substantially the same location at the output of the data path.

61. The method of claim 59 wherein said steps of initiating propagation of a first data and steering said first data are triggered by a first edge of a clock signal, and said steps of initiating propagation of a second data and steering said second data are triggered by a second edge of said clock signal after said first edge.

62. The method of claim 61 wherein said step of selecting said first data is triggered by an edge of said clock signal occurring a number of cycles after said first edge of said clock signal, wherein said number is one of 0, 1, 2, or greater.

63. The method of claim 61 further comprising the steps of:

initiating propagation of a third data along the data path after initiating propagation of said second data and before said second data reaches the output;

steering said third data into a third storage element after said step of steering said second data; and selecting said third data in said second storage element for output after said step of selecting said second data.

64. The method of claim 63 wherein said steps of initiating propagation of a third data and steering said third data are triggered by a third edge of said clock signal after said second edge.

65. The method of claim 64 wherein said step of selecting said first data is triggered by an edge of said clock signal occurring a number of cycles after said first edge of said clock signal, wherein said number is one of 0, 1, 2, or greater.

66. The method of claim 65 wherein said step of selecting said second data is triggered by an edge of said clock signal occurring a number of cycles after said first edge of said clock signal, wherein said number is one of 0, 1, 2, or greater.

67. In a memory circuit having a data path with an output, a method for pipelining data comprising the steps of:

initiating a first read cycle triggered by a first edge of a clock signal, said first read cycle generating a first read data;

propagating said first read data through the data path;

initiating a second read cycle triggered by a second edge of said clock signal after said first edge, said second read cycle generating a second read data before said first read data reaches the output;

propagating said second read data through the data path;

steering said first read data into a first storage element;

steering said second read data into a second storage element after said step of steering said first read data;

selecting said first read data in said first storage element for output, said step of selecting said first read data being triggered by said second edge of said clock signal; and selecting said second read data in said second storage element for output, said step of selecting said second read data being triggered by a third edge of said clock signal after said second edge.

68. The method of claim 67 wherein said second storage element is disposed at substantially the same location near the output in the data path as said first storage element.

\* \* \* \* \*

UNITED STATES PATENT AND TRADEMARK OFFICE
CERTIFICATE OF CORRECTION

PATENT NO.    : 5,713,005
DATED         : January 27, 1998
INVENTOR(S)   : Robert J. Proebsting It is certified that error appears in the above-identified patent and that said Letters Patent is hereby corrected as shown below:

Title page,
item [56], in the references, add a section for U.S. Patents as follows:

U.S. Patents

| | | | |
|---|---|---|---|
| 5,471,598 | 11/1995 | Quattromani et al. | 395/449 |
| 5,517,657 | 05/1996 | Rodgers et al. | 395/800 |
| 5,519,847 | 05/1996 | Fandrich et al. | 395/496 | item [56], in the references, add a section for Foreign Patents as follows:

Foreign Patents
  0 572 026 A    12/1993    EPO item [56], in the references add the two following articles to the "Publications" section:

Burlson, W. et al. "Wave-Pipelining: Is It Practical?" *IEEE Proc.* ISCAS '94, pp. 163-66, June 1994.

Fujiwara, A. et al. A 200 MHz 16 Mbit Synchronous DRAM with Block Access Mode." 994 Symposium on VLSI Circuits, *Digest of Technical Papers*, pp. 79080, May 1994.

Signed and Sealed this

Thirtieth Day of November, 1999

Attest:

Q. TODD DICKINSON

Attesting Officer

Acting Commissioner of Patents and Trademarks